(12) United States Patent
Gupta

(10) Patent No.: US 11,558,039 B2
(45) Date of Patent: Jan. 17, 2023

(54) METHOD AND ARRANGEMENT FOR ENSURING VALID DATA AT A SECOND STAGE OF A DIGITAL REGISTER CIRCUIT

(71) Applicant: MINIMA PROCESSOR OY, Oulu (FI)

(72) Inventor: Navneet Gupta, Oulu (FI)

(73) Assignee: MINIMA PROCESSOR OY, Oulu (FI)

( * ) Notice: Subject to any disclaimer, the term of this patent is extended or adjusted under 35 U.S.C. 154(b) by 328 days.

(21) Appl. No.: 16/768,443

(22) PCT Filed: Dec. 1, 2017

(86) PCT No.: PCT/FI2017/050852
§ 371 (c)(1),
(2) Date: May 29, 2020

(87) PCT Pub. No.: WO2019/106225
PCT Pub. Date: Jun. 6, 2019

(65) Prior Publication Data
US 2020/0389155 A1 Dec. 10, 2020

(51) Int. Cl.
*H03K 3/037* (2006.01)
*H03K 5/153* (2006.01)
(Continued)

(52) U.S. Cl.
CPC ............ *H03K 3/037* (2013.01); *H03K 5/153* (2013.01); *H03K 5/1534* (2013.01); *H03K 19/21* (2013.01)

(58) Field of Classification Search
None
See application file for complete search history.

(56) References Cited

U.S. PATENT DOCUMENTS

| 6,108,794 A | 8/2000 | Erickson |
| 2006/0220716 A1* | 10/2006 | Nicolaidis ............ H03K 3/0375 327/199 |

(Continued)

FOREIGN PATENT DOCUMENTS

EP    2738941 A1    6/2014

OTHER PUBLICATIONS

Chen, M. et al., Flip-flop Hardening ad Selection for Soft Error and Delay Fault Resilience, In: 24th IEEE International Symposium on Defect and Fault tolerance in VLSI Systems 2009, Oct. 2009, pp. 49-57.

(Continued)

*Primary Examiner* — Daniel C Puentes
(74) *Attorney, Agent, or Firm* — Alston & Bird LLP

(57) ABSTRACT

A digital value obtained from a preceding circuit element is temporarily stored and made available for a subsequent circuit element at a controlled moment of time. The digital value is received through a data input. A triggering signal is also received, a triggering edge of which defines an allowable time limit before which a digital value must be available at said data input to become available for said subsequent circuit element. Between first and second pulse-enabled subregister stages, an internal digital value from the first pulse-enabled subregister stage and information of the changing moment of said digital value at the data input in relation to said allowable time limit are used to ensure passing a valid internal digital value to the second pulse-enabled subregister stage. Said second pulse-enabled subregister stage makes said valid internal digital value available for said subsequent circuit element. A timing event observation signal is output as an indicator of said digital value at said data input having changed within a time (Continued)

window that begins at said allowable time limit and is shorter than one cycle of said triggering signal.

20 Claims, 12 Drawing Sheets

(51) Int. Cl.
    *H03K 5/1534*     (2006.01)
    *H03K 19/21*     (2006.01)

(56)     References Cited

U.S. PATENT DOCUMENTS

| | | |
|---|---|---|
| 2007/0168848 A1 | 7/2007 | Tschanz et al. |
| 2009/0085629 A1 | 4/2009 | Harris |
| 2014/0122947 A1* | 5/2014 | Bowman ............ G01R 31/3177 714/E11.023 |

OTHER PUBLICATIONS

International Search Report for PCT/FI2017/050852 dated Nov. 16, 2018 (4 pages).
Written Opinion for PCT/FI2017/050852 dated Nov. 16, 2018 (9 pages).

* cited by examiner

METHOD AND ARRANGEMENT FOR ENSURING VALID DATA AT A SECOND STAGE OF A DIGITAL REGISTER CIRCUIT

CROSS-REFERENCE TO RELATED APPLICATIONS

This application is a national phase entry of International Application No. PCT/FI2017/050852, filed Dec. 1, 2017, the entire contents of which are incorporated herein by reference.

FIELD OF THE INVENTION

The invention relates to the basic elements or cells of which integrated circuits are built. In particular the invention relates to the prevention of processing errors that could otherwise be caused by delays in relation to a triggering signal, such as a clock signal.

BACKGROUND OF THE INVENTION

Processing of data in integrated circuits may take place in pipelines where the outputs of one or more previous combinational logic units are to constitute the inputs of one or more subsequent combinational logic units. The intermediate results are stored in registers between said combinational logic units. A clock signal synchronizes the propagation of digital values through the pipeline; in particular the storing of values into the registers. Some of the basic building blocks for use as said registers are latches and flip-flops.

An important difference between a latch and a flip-flop is that a latch is transparent during the whole pulse of a clock signal (or enabling signal, or any other pulsed control signal): its output may acquire the appropriate value even as a function of an input value that arrives late, i.e. even if the input value changes its state after the beginning of the current clock pulse. A flip-flop will lock its output as a function of the input value(s) at a triggering edge of the clock pulse, so any changes in input values after that can only affect the output at the next triggering edge of the clock pulse. Single edge triggered flip-flops can only change their state at one (rising or falling) edge of the clock pulse, while double edge triggered flip-flops may change their state at both rising and falling clock edges.

In an ideal circuit each circuit element makes its output settle early enough before the data is read into the subsequent circuit element on the appropriate clock pulse. In practical circuits this is not always the case. If a previous circuit element in the pipeline is late in making its output settle, the subsequent circuit element may operate incorrectly or in an unpredictable way. In the worst case a time error like this may seriously derail the whole execution of an algorithm, and even in controlled cases it may require rolling back the processing and flushing erroneous data from the pipeline, causing delay and unnecessary consumption of energy.

Integrated circuits that run on extremely low supply voltages are particularly prone to time errors, because the low supply voltage boosts the effect of e.g. random structural differences between transistors and other micro-scale components in the circuit that theoretically should be identical to each other but in practice are not. One solution would be to maintain the supply voltage high enough, with a suitable safety margin, but that would work against the aim of minimizing the energy consumption of the circuit.

Latches may be more tolerant against time errors than flip-flops, because a late arriving input bit to a latch just causes a corresponding delay before the output of the latch settles at the appropriate value (as long as the delay was shorter than the clock pulse enabling the latch). If a subsequent combinational logic is quick enough, it may even catch up the delay so that at the input of the next circuit element the processing is on time again. This is called time borrowing: the operation of the latch allows a preceding circuit element to "borrow" some processing time from a subsequent circuit element. Conventional flip-flops do not allow time borrowing because they lock their output at an edge of the clocking pulse. However, flip-flops have certain other advantages that would advocate preferring them in designing integrated circuits.

A solution known as the Razor is a kind of flip-flop capable of at least detecting time errors. FIG. 1 illustrates the Razor principle. Initially the multiplexer 101 connects its upper input to output, so input data D1 goes to the main flip-flop 102, which reads it in on the rising edge of the clock pulse CLK. If the input data had settled in time, the same input value went into the shadow latch 103, which is controlled by a delayed clock CLKD. Identical outputs of the main flip-flop 102 and the shadow latch 103 go to the XOR gate 104, the output of which (named ERROR) remains low. If, however, the value of D1 changes after it was read into the main flip-flop 102, the outputs of the main flip-flop 102 and the shadow latch 103 are different. The ERROR signal will go high, which in turn makes the multiplexer 101 change its active input, eventually restoring the correct value from the shadow latch 103 to the main flip-flop 102 at the next rising edge of the CLK signal. A known drawback of the Razor approach is that a timing violation of the main flip-flop 102 may cause metastability in the output Q1. The metastability can propagate to the subsequent circuit element in the pipeline. The error correction mechanism also introduces an obligatory delay of one whole clock cycle before the output of the main flip-flop 102 is restored to the correct value.

SUMMARY

An objective of the present invention is to provide a register circuit for temporarily storing a digital value in a pipeline using the flip-flop approach but simultaneously allowing time borrowing. Another objective of the invention is to provide such an approach that would be applicable to both single edge and double edge triggered flip-flops. A further objective of the invention is that a register circuit according to the invention can be built both from library cells and from custom cells. Yet another objective of the invention is that the register circuit is capable of announcing the occurrence of time borrowing to other parts of the integrated circuit.

The objectives of the invention are achieved by providing, between first and second pulse-enabled subregister stages that together constitute a register circuit of flip-flop type, a timing event stage that is capable of using the output signal of the first pulse-enabled subregister stage and information about the time at which the latest change in input data arrived in relation to the allowable time limit to always ensure valid data at the input of the second pulse-enabled subregister stage. The timing event stage is also capable of outputting a timing event observation signal to indicate the occurrence of a timing event so that other parts of the integrated circuit can take the timing event into account.

A register circuit according to the invention is characterized by the features recited in the characterizing part of the appended independent claim directed to a register circuit.

An integrated circuit according to the invention is characterized in that it comprises at least one register circuit of the kind described above.

A method according to the invention is characterized by the features recited in the characterizing part of the appended independent claim directed to a method.

The invention covers also an embodiment in the form of a set of library instructions for designing a part of an integrated circuit, said set of library instructions being stored on a machine-readable tangible medium. They comprise one or more set of one or more machine-readable instructions that, when executed by a computer adapted for designing integrated circuits, are configured to effect the designing of a register circuit of the kind described above.

Further embodiments and advantages of the invention are described in the depending claims.

The verb "to comprise" is used in this text as an open limitation that does not exclude the existence of also other features in addition to those that are literally mentioned.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

It is obvious to a person skilled in the art that with the advancement of technology, the basic idea of the invention may be implemented in various ways. The invention and its embodiments are thus not limited to the examples described above; instead they may vary within the scope of the claims.

The embodiments of the invention are meant for use in integrated circuits in which digital data is processed in pipelines consisting of sequences of combinational logic units. In particular, embodiments of the invention are meant for use as register circuits that are used to temporarily store digital values obtained from an output of a preceding circuit element, for example from an output of a preceding combinational logic unit. Temporary storing means here that the output value of the preceding circuit element is read into the register circuit and made (and kept) available at the output of the register circuit for a duration of time that is determined by a clock signal.

Embodiments of the invention are generally categorized as register circuits of flip-flop type. This means that when the timing of the processing goes as intended, the digital value at the data input of the register circuit settles before an allowable time limit defined by a triggering edge of the clock signal, and the data output of the register circuit is locked to that value at the triggering edge. The allowable time limit is not at the triggering edge but slightly before it; the shortest allowable interval between the allowable time limit and the triggering edge is called the setup time of the register circuit of flip-flop type. Since the setup time is (essentially) constant and characteristic to the register circuit in question, the triggering edge of the clock signal may be said to "define" the allowable time limit, because the allowable time limit is always one setup time earlier than the triggering edge. The setup time is only a small fraction of the half cycle of the clock signal.

Figure 1:
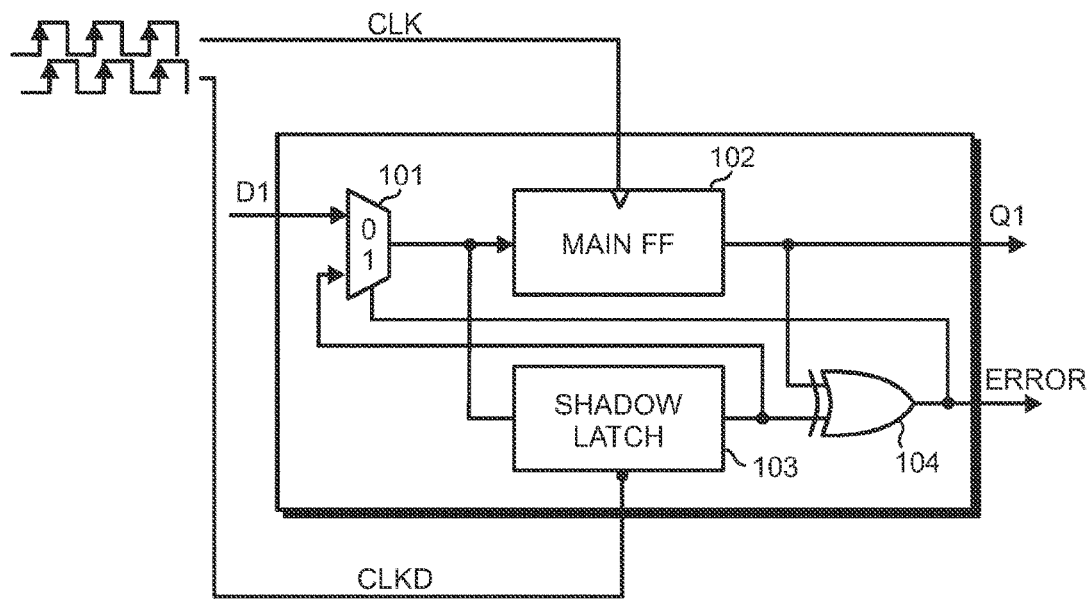
FIG. 1 illustrates a prior art register circuit.
Figure 2:
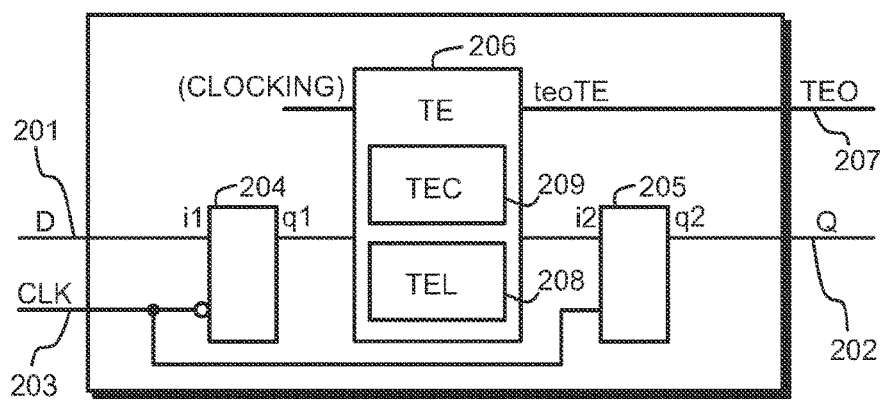
FIG. 2 illustrates a principle of a time borrowing register circuit of flip-flop type.

FIG. 2 illustrates a register circuit of flip-flop type for temporarily storing a digital value obtained from an output of a preceding circuit element. The preceding circuit element is not shown in FIG. 2, but the register circuit comprises a data input 201 for receiving said digital value for temporary storage. The register circuit comprises also a data output 202 for outputting the temporarily stored digital value. Capital letters D and Q are used to denote the signals at the data input 201 and the data output 202 respectively, according to conventional notation.

The register circuit of FIG. 2 comprises a triggering event input 203 for receiving a triggering signal, edges of which constitute triggering events to the register circuit. In synchronous circuits the signal brought to the triggering event input 203 is frequently referred to as the clock signal. The term clock signal can be used also in asynchronous circuits in order to emphasize that it is a signal, the edges of which have major significance, where an "enabling" signal is typically one, the pulses (high or low levels) of which have major significance. In this description the term clock signal is used for consistency to mean a triggering signal, edges of which constitute triggering events to the register circuit.

A triggering edge of the clock signal CLK brought to the triggering event input 203 defines an allowable time limit before which a digital value must appear at the data input 201 to become temporarily stored. As described earlier, for normal operation of the register circuit the allowable time limit is one setup time earlier than the triggering edge of the clock signal CLK.

On the data propagation path between the data input 201 and data output 202 there is a sequence of a first pulse-enabled subregister stage 204 and a second pulse-enabled subregister stage 205. Being pulse-enabled, the first and second subregister stages are transparent in the sense that whenever their enabling pulse is active, any change in the input of the respective pulse-enabled subregister stage is immediately reflected at its output. When the enabling pulse is not active, the output of the pulse-enabled subregister stage maintains the value it had when the enabling pulse was active last time, and is insensitive to any changes in its input value until the enabling pulse goes active again. Being in sequence on the data propagation path between the data input 201 and data output 202 means that data coming to the data input 201 must pass through the first pulse-enabled subregister stage 204 and the second pulse-enabled subregister stage 205 in this order before becoming available at the data output 202.

Between the first and second pulse-enabled subregister stages the register circuit of FIG. 2 comprises a timing event stage 206. It is configured to use an internal digital value from the pulse-enabled subregister stage 204 and information of the changing moment of the digital value at the data input 201 in relation to the allowable time limit to ensure passing a valid internal digital value to the second pulse-enabled subregister stage 205. Additionally the timing event stage 206 is configured to selectively output a timing event observation (TEO) signal at an output 207 of the register circuit. The TEO signal acts as an indicator of the digital value at the data input 201 having changed within a time window that begins at the allowable time limit and is shorter than one cycle of the clock signal CLK. In other words, the TEO signal acts as an indicator of the latest change in input value having arrived late at the register circuit.

According to an embodiment of the invention the register circuit of FIG. 2 is a so-called single edge triggered flip-flop, meaning that the triggering edges of the clock signal are either its rising edges or its falling edges, but not both. We may assume that the register circuit of FIG. 2 is a rising-edge triggered flip-flop. Thus the first pulse-enabled subregister stage 204 may be a latch, the enabling signal of which is an inverse of the clock signal CLK, while the second pulse-enabled register stage 205 may be a latch, the enabling signal of which is the clock signal CLK as such. The inputs and outputs to the latches are denoted with lowercase letters i1, q1, i2, and q2 respectively.

Figure 3:
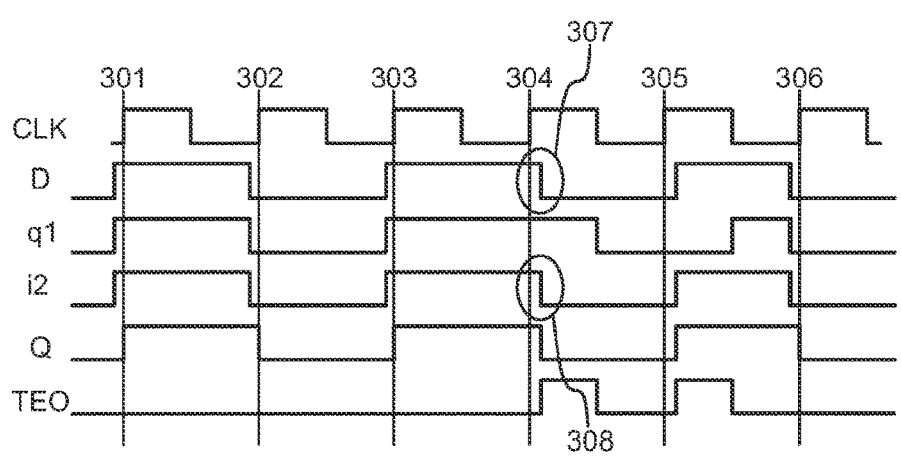
FIG. 3 illustrates a timing diagram of certain signals in a register circuit according to FIG. 2.

The timing diagram of FIG. 3 illustrates an example of the operation of a register circuit according to an embodiment of the invention. The allowable time limit before each rising edge of the clock signal is not separately illustrated in FIG. 3. For graphical clarity it is easiest to use a conventional notation, according to which all changes in the signal D at the data input that are drawn on the left side of the corresponding moment of time are assumed to come in time, i.e. before the allowable time limit, while changes in D that are drawn on the right side of the corresponding moment of time are assumed to come late, i.e. after the allowable time limit.

At moments 301, 302, and 303 the change in signal D at the data input, i.e. the change in the received digital value, takes place in time. The clock signal is low when the change occurs, meaning that the enabling signal to the first latch 204 is active, and the change in D is appropriately reflected in the output q1 of the first latch 204. Since the change in input data came in time, the timing event stage 206 passes the internal digital value at the output q1 of the first latch 204 as such through to the input i2 of the second latch 205. The second latch 205 becomes enabled at the rising edge of the clock signal CLK, reads the digital value at its input i2, and passes it to its output q2 so that it becomes available as the output signal Q of the whole register circuit.

At moment 304 a triggering (rising) edge occurs again in the clock signal CLK, but the change 307 in signal D at the data input was late. This is a timing event: the digital value at the data input 201 of the register circuit changed too late, i.e. within a time window that begins at the allowable time limit and is shorter than one cycle of the clock signal CLK.

At moment 304 the first latch 204 becomes disabled, so the internal digital value at its output q1 remains the same it was at moment 304. Basically the timing event stage 206 does not know yet, whether the lack of change in the internal digital value at the output q1 of the first latch was because the input data D did not change at all or whether it was because the change in input data D came late. When the change 307 in input data D then occurs, slightly after moment 304 in FIG. 3, the timing event stage 206 finds out that there was a timing event and that the valid internal digital value to be passed to the second latch 205 is actually the inverse of the current internal digital value at the output q1 of the first latch 204. The resulting change 308 from high to low in i2 slightly after moment 304 in FIG. 3 is a result of the timing event stage 206 using the internal digital value from the first latch 204 and information of the changing moment of the digital value at the data input 201 in relation to the allowable time limit to ensure passing a valid internal digital value to the second latch 205.

The timing event stage 206 raises the timing event observation signal TEO high as an indicator of the observed timing event. In other words, the high value of the TEO signal after moment 304 acts as an indicator of the digital value at the data input 201 having changed within a time window that begins at the allowable time limit and is shorter than one cycle of the clock signal CLK. An essential consequence of the late-arriving change in input data is that also the corresponding change in signal Q at the data output takes place late. Thus an alternative interpretation of the meaning of the TEO signal is that it acts as an indicator of the digital value at the data output 202 having changed later than at the triggering clock edge at which the change should have occurred.

A similar incident occurs at moment 305 in FIG. 3. Again, the change in input data D takes place late, after the allowable time limit of the register circuit, i.e. within a time window that begins at the allowable time limit and is shorter than one cycle of the clock signal CLK. It must be noted that meanwhile the internal digital value at the output q1 had acquired the value that appropriately reflected the previous late-arriving change in D: when the first latch 204 became enabled by the low-going clock pulse in the middle between moments 304 and 305, it passed the actual value of D into its output q1. However, the first latch 204 becomes disabled again at moment 305, so its output q1 is left at the value it had, neglecting again the late-arriving change in D for the moment. Again the timing event stage 206 uses the internal digital value from the first latch 204 and information of the changing moment of the digital value at the data input 201 in relation to the allowable time limit to ensure passing a valid internal digital value to the second latch 205: both i2 and Q go high immediately after the timing event was observed, shortly after moment 305.

The timing event stage 206 should be configured to output a TEO signal as an indicator of an observed timing event separately for each occurred timing event. In FIG. 3 it is assumed that the TEO signal went back low at the falling (non-triggering) edge of the clock signal in the middle between moments 304 and 305. Since a timing event was observed again at moment 305 (or, to be quite accurate, slightly after moment 305 when the late-arriving change in D took place), the TEO signal goes high again after moment 305 and stays high until it is reset at the next falling edge of the clock signal CLK.

It is illustrative to consider the timing event stage 206 as comprising a timing event logic 208 and a timing event controller 209. These two are not necessarily strictly separate entities, but they may share some components and/or functionalities. According to one embodiment, the timing event logic 208 is configured to selectively invert the internal digital value obtained from the first pulse-enabled subregister stage 204. The timing event controller 209 in turn is configured to actually detect the late changes in input data, i.e. to detect any change of the digital value at the data input 201 within a time window that begins at the allowable time limit and is shorter than a half cycle of said clock signal. The timing event controller is then additionally configured to make the timing event logic 208 effect said selective inverting as a response to such change having been detected. This kind of operation is based on the observation that can be made in FIG. 3: whenever the change in input data comes late, the output of first latch 204 is temporarily stuck on the inverse of what would be a valid internal value. An inverse of the inverse is then the valid internal digital value that can be delivered from the timing event logic 208 to the second latch 205.

There are several approaches to making the timing event stage 206 capable of detecting, when a digital value at the data input 201 changed late, i.e. within a time window that begins at the allowable time limit and is shorter than one cycle of the clock signal. Input signals that the timing event stage 206 uses for such detecting must necessarily carry some information about changes in the input data signal D as well as their relation to the triggering edges in the clock signal CLK. However, the timing event stage 206 does not necessarily need to receive directly any of D or CLK, if the appropriate information can be derived indirectly. Therefore FIG. 2 shows the word CLOCKING in parentheses. Alternative approaches concerning the structure and function of the timing event stage are described in the following.

Figure 4:
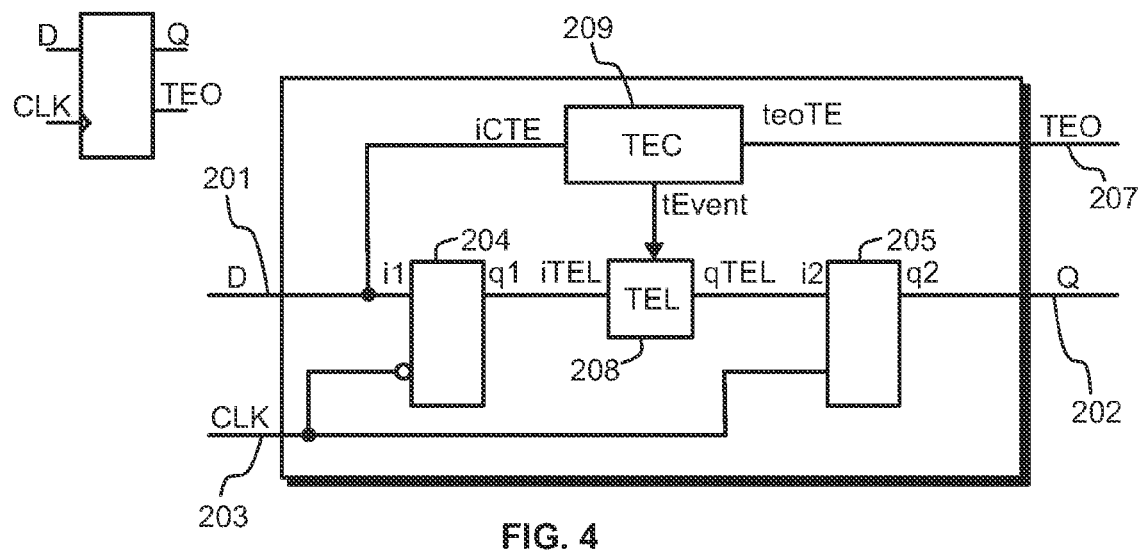
FIG. 4 illustrates a register circuit according to an embodiment.
Figure 5:
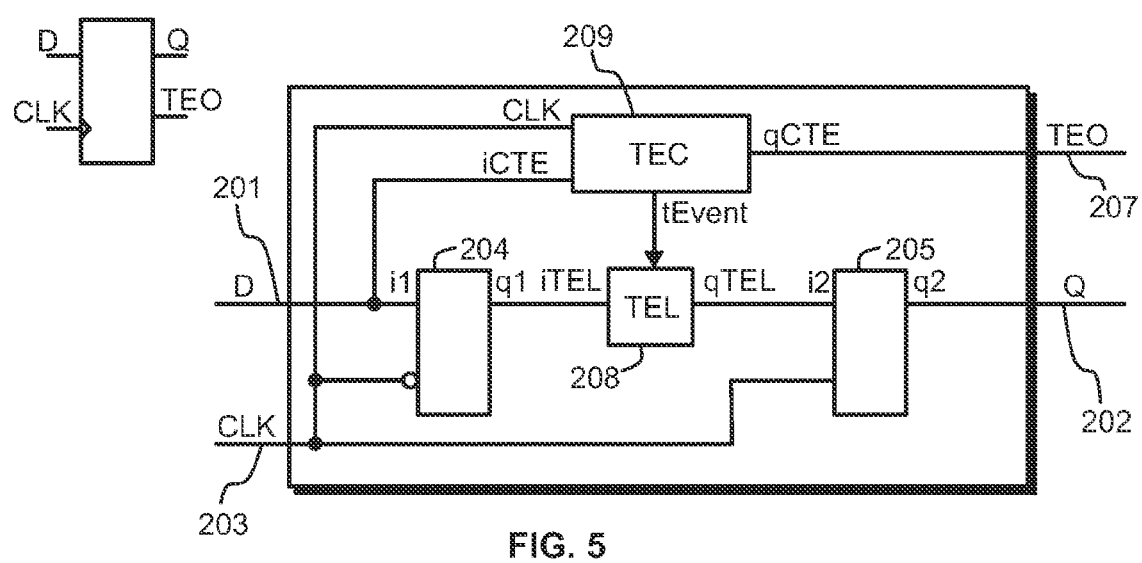
FIG. 5 illustrates a register circuit according to an embodiment.
Figure 6:
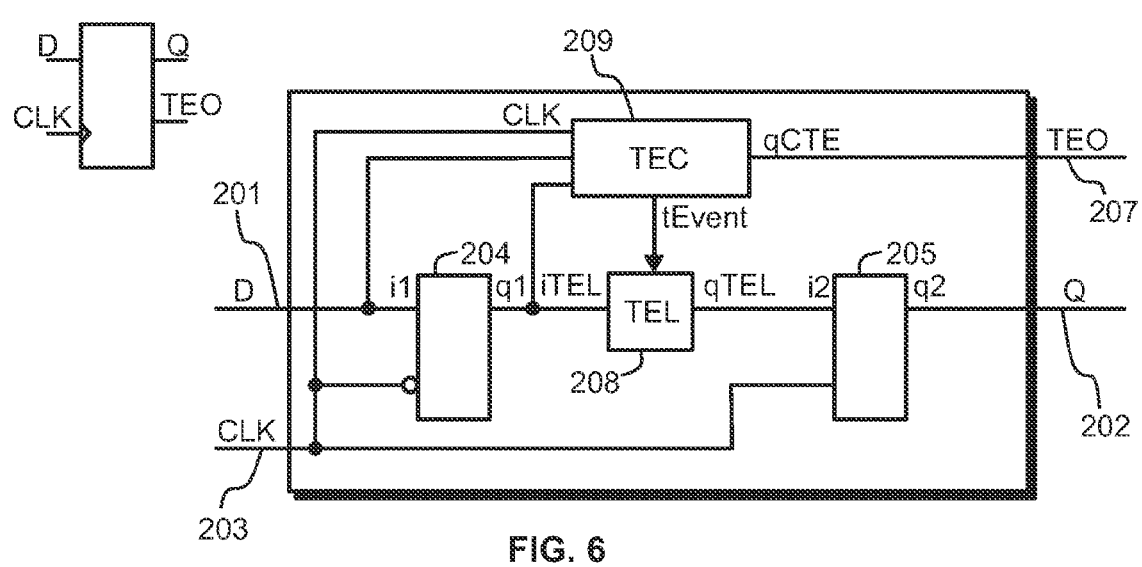
FIG. 6 illustrates a register circuit according to an embodiment.

FIGS. 4 to 6 illustrates some alternatives of input signals that the timing event stage may use for detecting late changes in the input data. In FIG. 4 the timing event stage, in more detail the timing event controller 209, only receives the input data as such as its input signal iCBTL. The timing event controller 209 may act merely as a transition detector that outputs the TEO signal and lets the other, external circuit elements (not shown in FIG. 4) monitor its timing relative to the clock signal and take action if needed.

In FIG. 5 the timing event controller 209 receives both the input data and the clock signal as its inputs iCBTL and CLK respectively. In this case it is relatively easy for the timing event controller 209 to detect changes in the input data D and compare their moment of occurrence to the triggering edges in the clock signal CLK. The timing event controller 209 has been built to take into account the setup time of the register circuit, so it actually compares the moments when changes in the input data D occur to the allowable time limit, and outputs the signals tEvent and qCTE if the input data changed within a time window that begins at the allowable time limit and is shorter than or equal to one half clock cycle of the clock signal.

FIG. 6 illustrates a versatile embodiment in which the timing event controller 209 receives the input data D, the internal digital value q1 from the first pulse-enabled subregister stage 204, and the clock signal CLK as its inputs. In this case the timing event controller 209 may for example actually observe, whether a change in input data that came very close to the allowable time limit of the register circuit made it through the first pulse-enabled subregister stage 204 or not. Thus it knows not to activate the tEvent and TEO signals if the change was in time after all, even with a very narrow marginal.

A further alternative could be one where the timing event controller would receive the input data D and the internal digital value q1 from the first pulse-enabled subregister stage 204 as in FIG. 6, but not the clock signal CLK. In such an embodiment the timing event controller would simply compare the D and q1 signals to each other and activate the tEvent and TEO signals if there was a change in D that did not come through to q1 even if it should have come.

Figure 7:
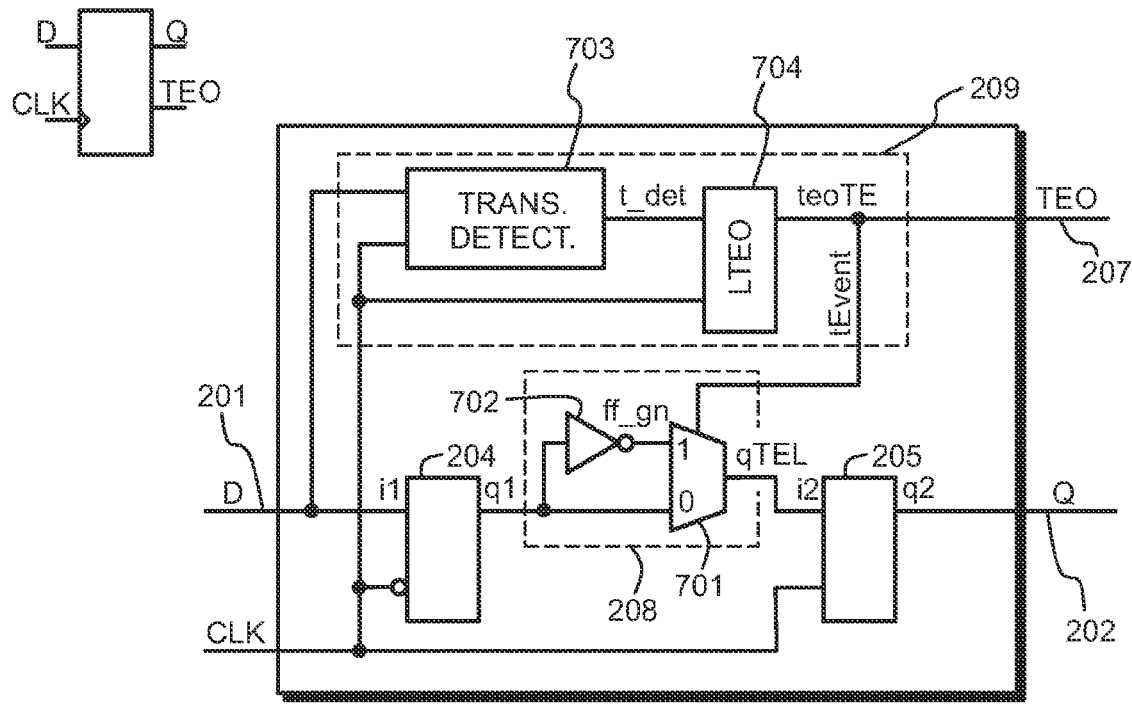
FIG. 7 illustrates a register circuit according to an embodiment.

FIG. 7 illustrates, among others, one possibility for the internal structure of the timing event logic 208. In FIG. 7 the timing event logic 208 comprises a multiplexer 701 and two parallel value propagation paths from the output of the first pulse-enabled subregister stage 204 to the respective inputs of the multiplexer 701. One of the parallel value propagation paths comprises an inverter 702 configured to invert the value going through that value propagation path with respect to the value going through the other propagation path. The multiplexer 701 is configured to couple one of the above-mentioned parallel value propagation paths to the input of the second pulse-enabled subregister stage 207 in accordance with the selection signal tEvent, which is actually the same as the timing event observation signal TEO.

The timing event controller 209 of FIG. 7 comprises a transition detector 703 as well as a timing event observation latch 704, the enabling signal of which is the clock signal CLK. The input signals to the transition detector 703 are the input data signal D and the clock signal CLK. The transition detector 703 may be configured to give an active signal at its output t_det whenever it detects a change in the value of the input data signal D after the allowable time limit of the register circuit. A high level of the CLK signal enables the timing event observation latch 704, which consequently reads in the high level of the t_det signal and makes it available at its output teo-TE, from which it is provided as the selection command tEvent to the multiplexer 701 and as the timing event observation signal TEO to the corresponding output of the register circuit.

If a latch is used for generating the tEvent and TEO signals as in FIG. 7, care must be taken to ensure that after activating the tEvent and TEO signals in response to an individual detected timing event they are deactivated, i.e. the timing event observation latch 704 is reset, in time so that the active level does not carry on for too long. It is possible that the immediately following change in the input data signal D, i.e. the one to be made available at the output of the register circuit at the immediately following triggering edge of the clock signal, is in time again, so that it will be quite appropriately read into the first pulse-enabled subregister stage 204 and made to propagate through the register circuit without further action needed from the timing event logic.

Figure 8:
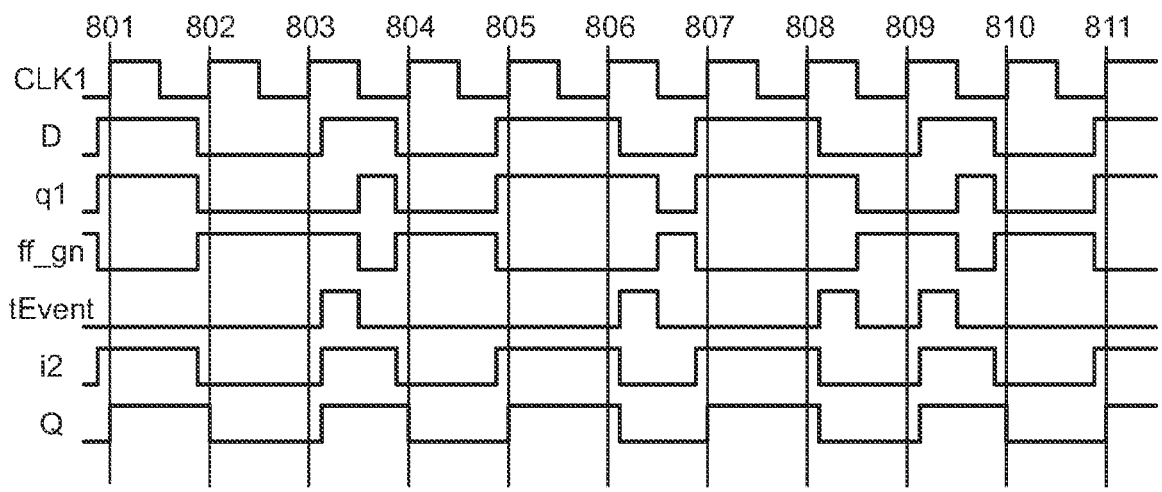
FIG. 8 is a timing diagram of certain signals in a register circuit according to FIG. 7.

FIG. 8 is a signal timing scheme that illustrates some of the signals named in FIG. 7 in an arbitrary example case where the value of the input data signal changes in every clock cycle. The changes in the input data signal D that should have taken place before moments 803, 806, 808, and 809 are late. Consequently the signal tEvent goes high for half a clock cycle after each of them, causing the multiplexer 701 to select the signal ff_gn (which is the inverse of q1) instead of q1. At the subsequent falling clock edge the signal q1 assumes the valid value, so tEvent can go low again, continuing to provide the valid value for the input i2 of the second pulse-enabled subregister stage 205.

An alternative embodiment is one where the timing event logic 208 comprises an XOR gate, one input of which is coupled to receive the tEvent signal and the other input of which is coupled to receive the output of the first pulse-enabled subregister stage. Such an embodiment works essentially as a selective inverter, because if the tEvent signal is high, the output of the XOR gate is the inverse of the value in its other input. This and other alternative embodiments can be applied in all register circuits according to the invention where a selective inversion is illustrated as the implementation of block 208.

Figure 9:
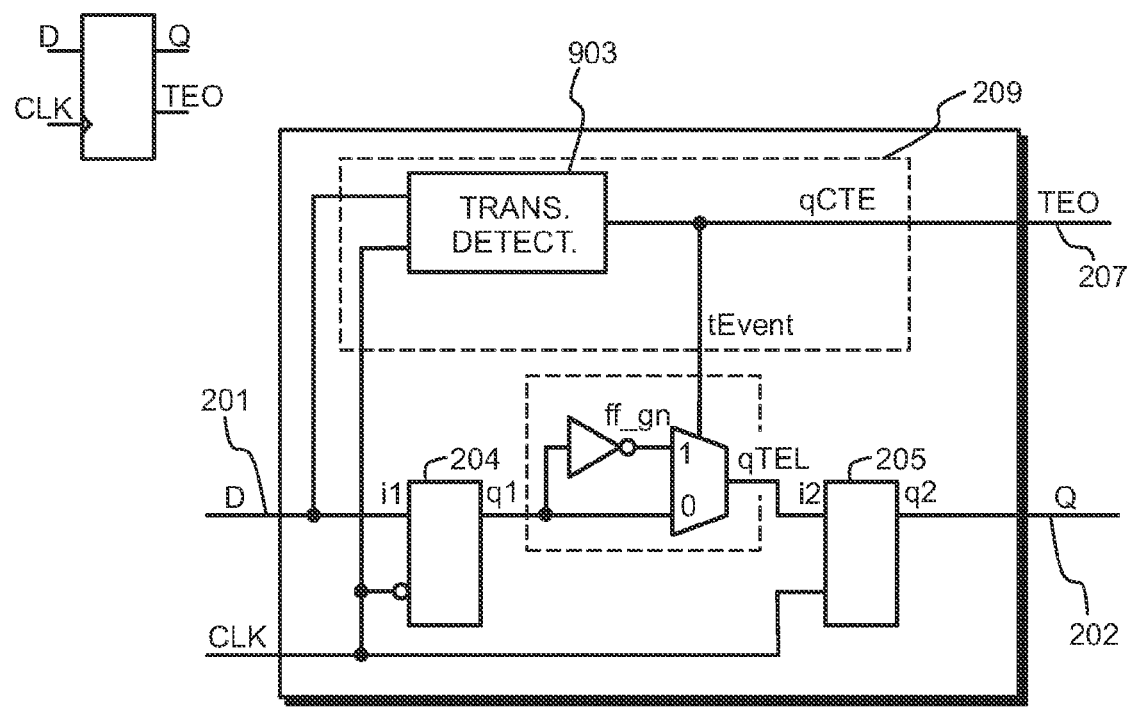
FIG. 9 illustrates a register circuit according to an embodiment.

FIG. 9 illustrates an alternative embodiment where no timing event observation latch is used. The input signals to the transition detector 903 are the same as above in FIG. 7, but in the embodiment of FIG. 9 it is completely on the responsibility of the transition detector to ensure that its output signal qCBTL remains active only exactly as long as is needed after each detected timing event.

A feature common to the embodiments of all FIGS. 4 to 9 is that the length of the time window, during which any change in the input data signal D is considered as arriving late, is defined by an internal feature of the timing event stage 206. Thus, as shown by the small-scale register circuit symbols in the upper left corner of each of FIGS. 4 to 7 and 9, the inputs to the register circuit do not need to comprise other than the data input and clock input. As such, it is known how to build circuit elements that react to changes occurring within a time window defined by internal features of such circuit elements, so further discussion can be omitted in this description. However, there exists a class of alternative embodiments in which the register circuit comprises a time window input for receiving a pulsed signal pulses of which are to define the length of the time window.

Figure 10:
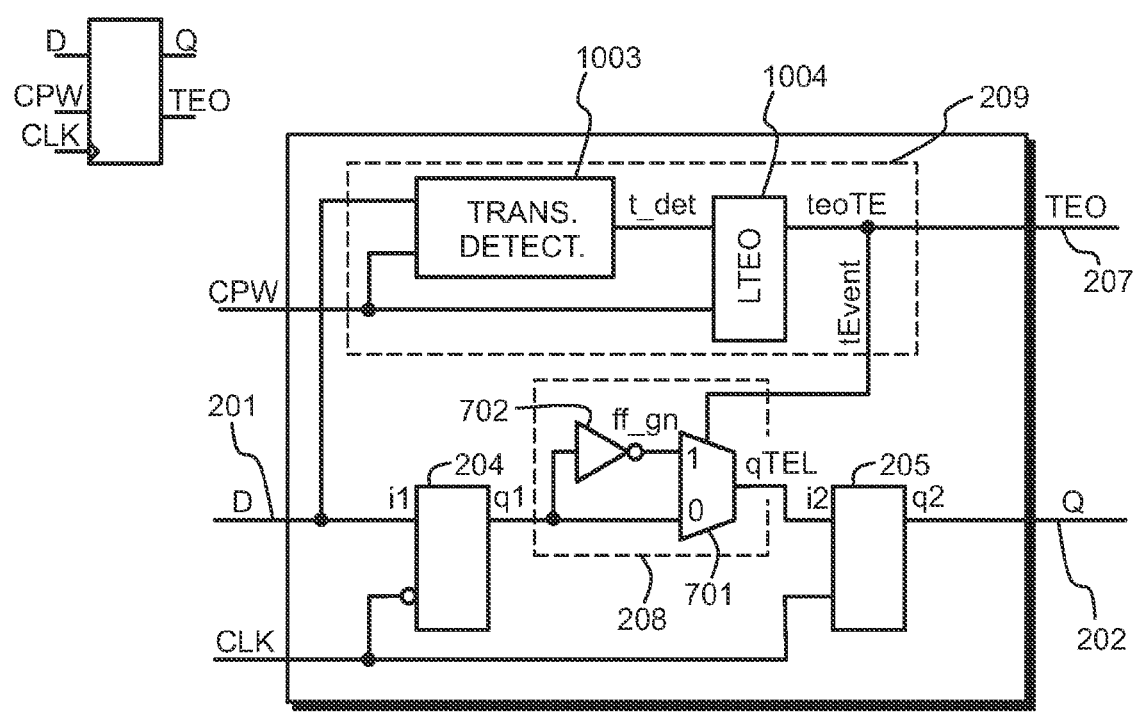
FIG. 10 illustrates a register circuit according to an embodiment.

The embodiment shown in FIG. 10 is an example of the last-mentioned kind. As shown in the upper left corner of FIG. 10 the register circuit comprises an additional input for a clock pulse window (CPW) signal. This additional input may be called the time window input, and inside the register circuit is may be coupled to the timing event stage, like in FIG. 10. Otherwise the register circuit of FIG. 10 resembles internally that of FIG. 7: the timing event logic 208 comprises the multiplexer 701 and the two parallel value propagation paths, one of which comprises the inverter 702; and the timing event controller 209 comprises a transition detector 1003 and a timing event observation latch 1004. However, the two last-mentioned are clocked by the clock pulse window signal CPW instead of the clock signal CLK.

The clock pulse window signal CPW may be for example a phase-shifted version of the clock signal CLK, so that either the time when the two are equal or the time when the two have opposite values defines the time window during which late-arriving changes in input data should be detected. Another possibility is to use as the clock pulse window signal a pulsed signal, the active pulses of which correspond to the time window being open (or closed, in case of inverse logic).

Figure 11:
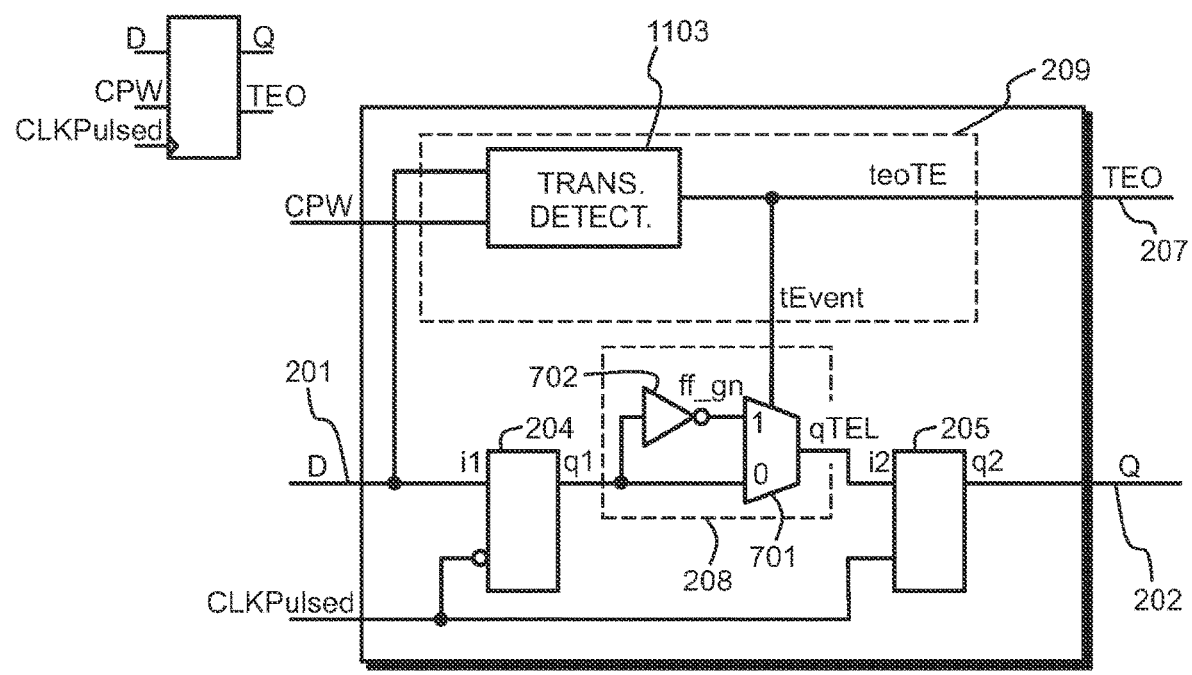
FIG. 11 illustrates a register circuit according to an embodiment.

FIG. 11 is an example of an embodiment of the last-mentioned kind. The signal CLKPulsed being at high level corresponds to the time window being open; in other words, a change in input data D that comes when the signal CLKPulsed is high is considered to have arrived late. The signal CPW to the transition detector 1103 can be the same signal as CLKPulsed. Any change in the input data signal D that arrives while CLKPulsed is low gets read into the first pulse-enabled subregister stage 204. Since the change arrived in time, the tEvent signal remains low, and the output q1 of the first pulse-enabled subregister stage 204 goes through the lower input of the multiplexer 701 to the input of the second pulse-enabled subregister stage 205, from where it gets latched to the output 202 of the register circuit at the next rising edge of the CLKPulsed signal. If the change in input data D arrived late, the first pulse-enabled subregister stage 204 has been disabled already and its output signal q1 represents the value of the input signal D before the late-arriving change. The transition detector 1103 notices this and makes the selection signal tEvent high, causing the inverted output signal ff_gn of the first pulse-enabled subregister stage 204 to be selected as the valid internal digital value to the second pulse-enabled subregister stage 205.

Figure 12:
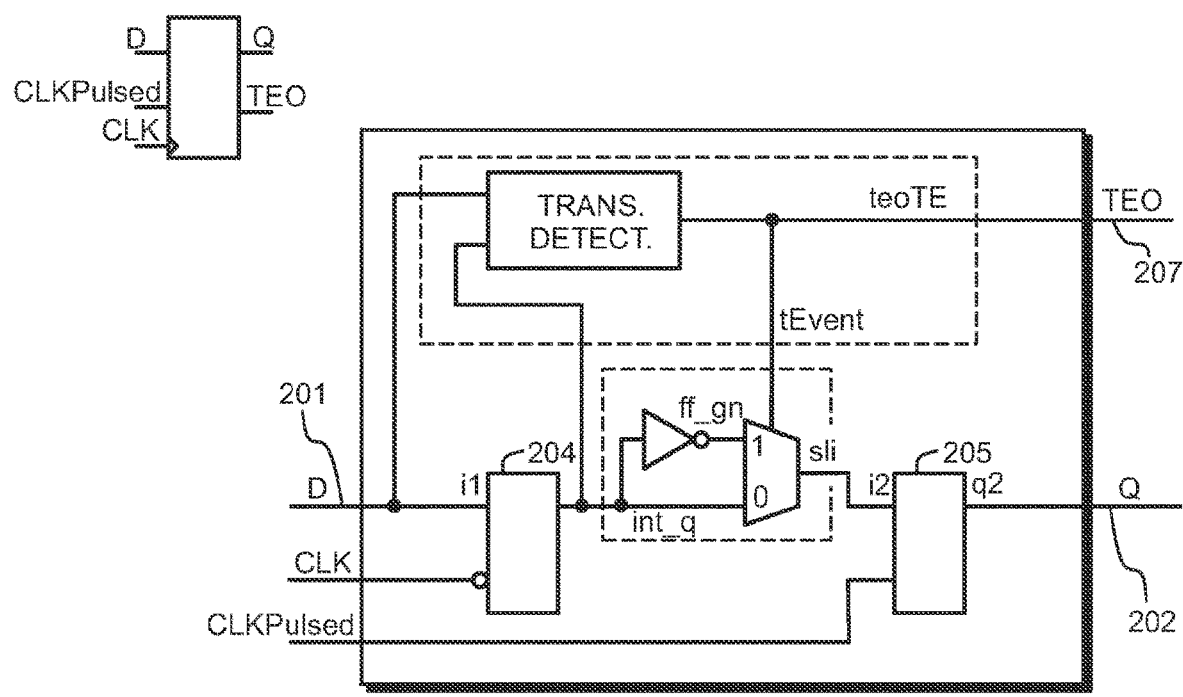
FIG. 12 illustrates a register circuit according to an embodiment.

A pulsed variant of the clock signal, i.e. a clock signal that may have other than 50% duty cycle, can be used as a signal that clocks only one of the pulse-enabled subregister stages, while the other is clocked with the regular CLK signal. FIG. 12 shows an embodiment in which the (inverted) CLK signal clocks the first pulse-enabled subregister stage 204, while the pulsed clock signal CLKPulsed clocks the second pulse-enabled subregister stage 205. This way one can choose when to trigger the second pulse-enabled subregister stage 205, i.e. when to take into use the output signal of the first pulse-enabled subregister stage.

Figure 13:
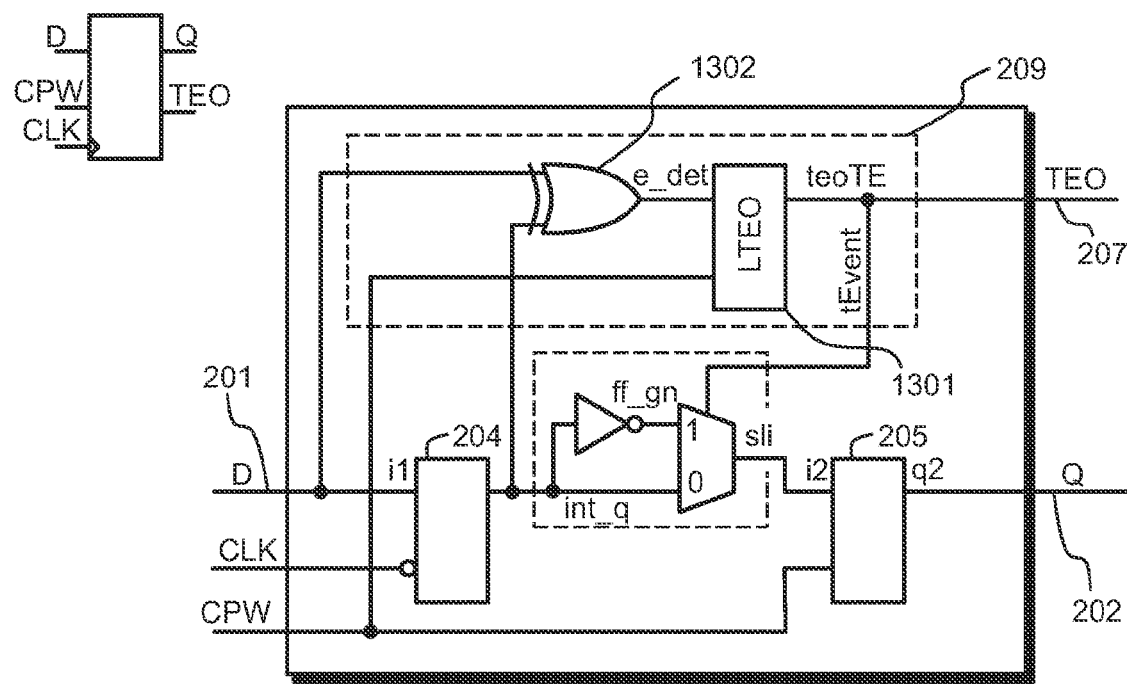
FIG. 13 illustrates a register circuit according to an embodiment.

FIG. 13 illustrates another example of having separately formed clock pulses for the first and second pulse-enabled subregister stages. Here the clock pulse window signal CPW clocks also the latch 1301 in the timing event controller 209, which latch 1301 gets a high signal in its input whenever the input and output values of the first pulse-enabled subregister stage 204 are different, due to the XOR gate 1302. The clock pulse window signal CPW may be of the delayed variant, in which the difference between the rising edges of the CLK and CPW signals defines the time window, or of the duty cycle adjusted variant, in which the high value of the signal indicates the interval when the time window is open for detecting late-arriving changes in input data.

The principle of having a timing event stage between the first and second pulse-enabled subregister stages and making it ensure a valid internal digital value to the second stage can be applied also in register circuits of the double edge triggered flip-flop type.

Figure 14:
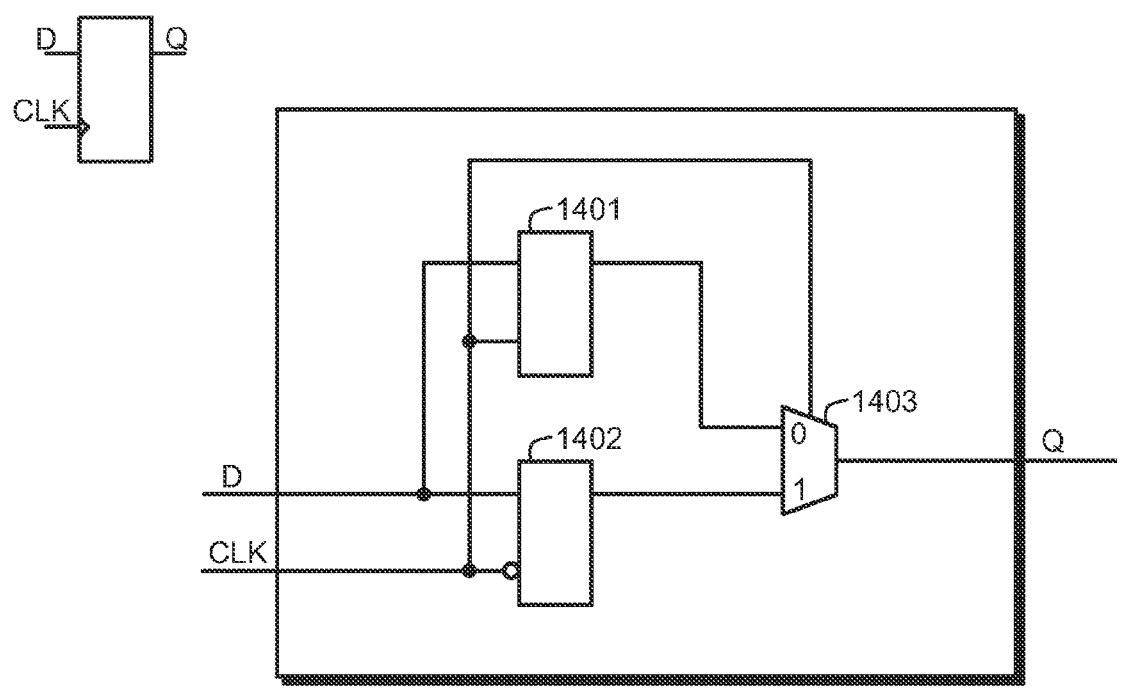
FIG. 14 illustrates a general principle of a double edge triggered flip-flop.

FIG. 14 illustrates a standard double edge triggered flip-flop that is not capable of time borrowing. It comprises a data input for receiving an input data signal D, and a data output for outputting an output data signal Q, as well as a clock input (or, more generally, a triggering event input) for receiving a clock signal CLK. The first pulse-enabled subregister stage of the register circuit of FIG. 14 comprises first and second parallel latch branches clocked at opposite phases of the clock signal CLK. The upper latch branch comprises a clocked latch 1401, and the lower latch branch comprises a clocked latch 1402. The data inputs of each of these is coupled to the data input of the whole register circuit.

The second pulse-enabled subregister stage of the register circuit in FIG. 14 comprises a multiplexer 1403 clocked by the same clock signal CLK as the clocked latches 1401 and 1402 of the first pulse-enabled subregister stage. The data outputs of the clocked latches 1401 and 1402 are coupled to the respective inputs of the multiplexer 1403. When the clock signal CLK is low, only the lower clocked latch 1402 is enabled and reads in changes in the input data D, while the output data D has the value that was most recently stored in the upper clocked latch 1401, and vice versa.

Concerning late-arriving changes in the input data D, the standard double edge triggered flip-flop of FIG. 14 has the same problems as a standard single edge triggered flip-flop. For example, is a change in input data that should have occurred while the clock signal CLK was low is late, it arrives only when the clock signal CLK has gone high already. At that time only the upper clocked latch 1401 is enabled, but the multiplexer 1403 selects the value from the lower branch, which is the value that the lower clocked latch 1402 stored before the most recent change in input data, and thus incorrect.

Figure 15:
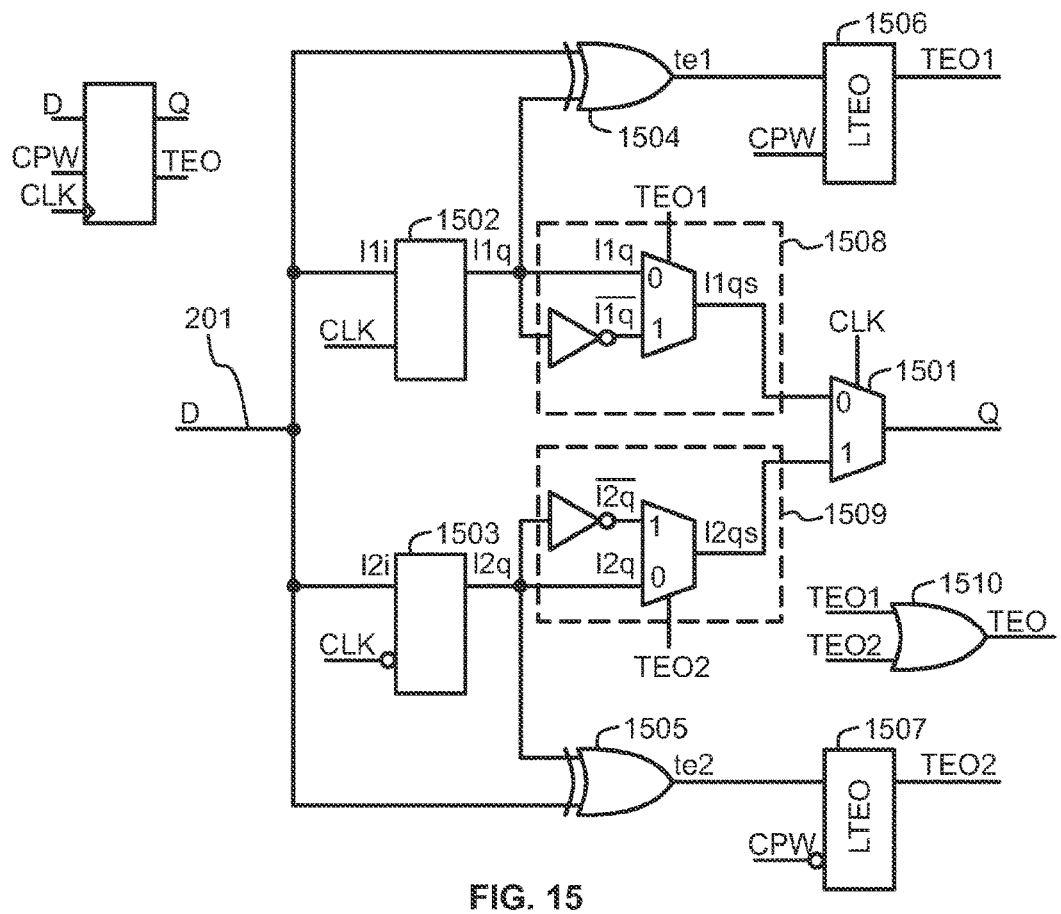
FIG. 15 illustrates a register circuit according to an embodiment.

FIG. 15 illustrates a register circuit that is basically a double edge triggered flip-flop but includes the capability of time borrowing. Following the general principle of double edge triggered flip-flops, the first pulse-enabled subregister stage comprises first and second parallel latch branches clocked at opposite phases of the clock signal CLK. In FIG. 15 the division between the first and second parallel latch branches goes along an imaginary horizontal line at the level of the data input 201. The second pulse-enabled subregister stage comprises a multiplexer 1501 clocked by the clock signal CLK. Each of the first and second parallel latch branches comprises a clocked latch 1502 and 1503, an input of which is coupled to the data input 201.

From each of the first and second latch branches there is a coupling to a transition detector configured to detect timing events in the respective latch branch. In FIG. 15 each latch branch has a transition detector of its own, and the transition detectors are configured to perform such detecting through comparison of input and output values of the respective clocked latch: see the XOR gates 1504 and 1505. Each transition detector is further configured to produce a respective timing event observation component signal in response to a detected timing event; see latches 1506 and 1507. In particular, if the input and output values of the respective clocked latch 1502 or 1503 are different, the corresponding XOR gate 1504 or 1505 gives a high output value te1 or te2, which is temporarily stored in the corresponding latch 1506 or 1507 and output as the timing event observation component signal TEO1 or TEO2. An alternative embodiment would comprise a common transition detector, to which there would be couplings from each of the first and second latch branches. Such a shared transition detector may be common to even more than two latch branches: for example common to latch branches of more than one register circuit.

Each of the first and second parallel latch branches comprises, between an output of the clocked latch of that latch branch and a respective input of the multiplexer 1501, an arrangement configured to selectively invert the output value of the clocked latch in response to a timing event observation component signal produced in that latch branch. In the upper latch branch said arrangement is shown with the reference designator 1508, and in the lower latch branch with the reference designator 1509. Each of these arrangements is similar to the timing event logic 208 that has been described earlier with reference to FIG. 7, and the selection between a non-inverted and inverted signal is made in accordance with the appropriate timing event observation component signal TEO1 or TEO2 respectively.

The timing event observation component signals TEO1 and TEO2 serve also to produce the timing event observation signal TEO of the whole register circuit: the register circuit is configured to produce said timing event observation signal as a combination of the timing event observation component signals from the first and second parallel latch branches. FIG. 15 shows an example in which an OR gate 1510 is used to produce such a combination so that the TEO signal is active whenever at least one of the timing event observation component signals TEO1 and TEO2 is active. Other implementations are possible; the purpose of the TEO signal is to indicate that a timing event has been observed, in this case irrespective of whether it related to a rising or falling edge of the clock signal, so a combination of the kind shown in FIG. 15 is a relatively straightforward way of fulfilling this purpose.

Figure 16:
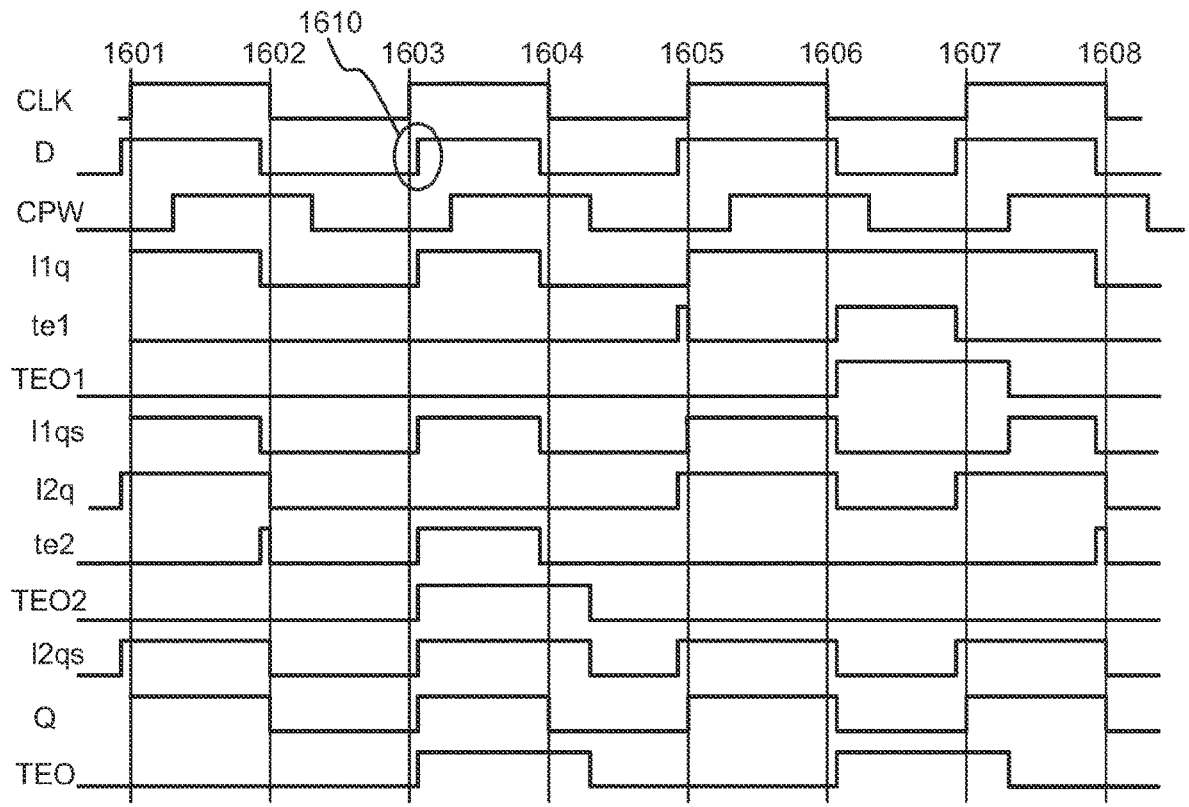
FIG. 16 is a timing diagram of certain signals in a register circuit according to FIG. 15.

The timing event observation latches 1506 and 1507 are clocked with the clock pulse window (CPW) signal, which may be for example a phase-shifted version of the clock signal like in the example of FIG. 16. In this case the time window for detecting a late-arriving change in input data is the time between the rising edges of the CLK and CPW signals. As an example, the late-arriving change in input data related to moment 1603 may be described. The change 1610 in input data D should have come before the moment 1603, but it was late so that the CLK signal had gone high already. The changes of input data related to the rising edges of the clock signal CLK should be read into the lower latch branch, so while the internal digital value 12q would have gone high if the change 1603 had come in time, it now remains low.

When the input data assumes a high value at 1610, the XOR gate 1505 gets two different input values so its output te2 goes high. At this point the CPW signal is still low, so its inverse keeps the lower timing event observation latch 1507 still enabled, and the high value of te2 becomes stored and appears at the output TEO2, also after the CPW signal goes high at the end of the time window for detecting late-arriving input data. The high value of TEO2 makes the arrangement 1509 select the inverse of the current value of 12q and provide it as the valid internal digital value 12qs to the multiplexer 1501 in the second pulse-enabled subregister stage, from which it goes through to the output as the output data signal Q. The timing event observation component signal TEO2 remains high until the timing event observation latch 1507 is enabled again by the falling edge of the CPW signal between moments 1604 and 1605.

A similar chain of events occurs after moment 1606, when a change in the input data signal D related to a falling edge of the clock signal CLK arrives late. Changes in input data related to the falling edges of the clock signal CLK should be read into the upper latch branch, so this time the latch 1502, the XOR gate 1504, the latch 1506, and the arrangement 1508 are involved, and the signals to be followed in the timing diagram of FIG. 16 are CLK, D, CPW, 11$q$, te1, TEO1, 11$qs$, Q, and TEO.

An alternative embodiment to the one shown in FIG. 15 is one where the selective inversion arrangements 1508 and 1509 are removed, and an XOR gate is added that gets the TEO signal in one of its inputs and the output signal of the multiplexer 1501 in the other. This alternative embodiment is based on the same approach as the alternative embodiment described earlier for FIG. 7, in which the selective inversion arrangement inside a single edge triggered flip-flop was replace with a XOR gate with TEO at its one input: if TEO constitutes one input of an XOR gate, the XOR gate constitutes essentially a controllable inverter, so that a high value of TEO causes the output of the XOR gate to be the inverse of its other input.

Clock gating is a technique used in integrated circuits to save energy by avoiding unnecessary changes of state. If digital data is processed in a pipeline where the intermediate results given by combinational logic units are stored in registers, it may happen that the intermediate result stored in a particular (set of) register(s) does not change at all at a certain triggering edge, or even at a number of consecutive triggering edges. In such a case it is advisable to temporarily disable the clocking of the subsequent stages in the same pipeline, because their outputs would remain the same anyway.

Figure 17:
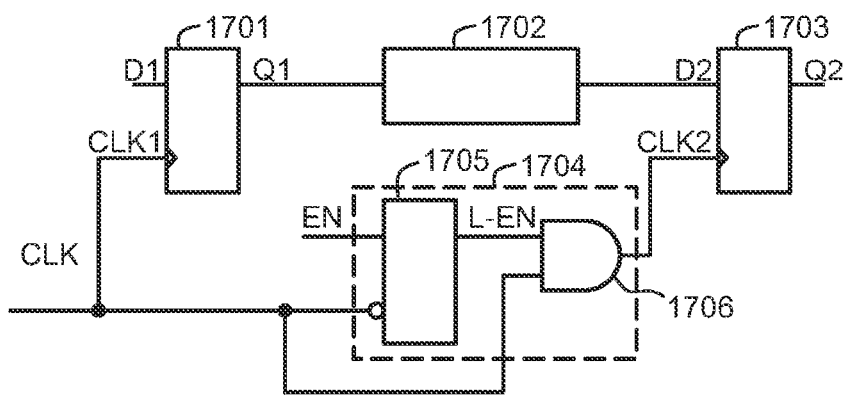
FIG. 17 illustrates a general principle of clock gating.

FIG. 17 shows a basic example of a pipeline in which clock gating is used. A first register circuit 1701 is clocked with a clock signal CLK. Its output serves as the input of a subsequent combinational logic unit 1702, the output of which is in turn stored in the second register circuit 1703. The clock signal to the second register circuit 1703 is derived from that of the first register circuit 1701 by taking it through a clock gating cell 1704.

Figure 18:
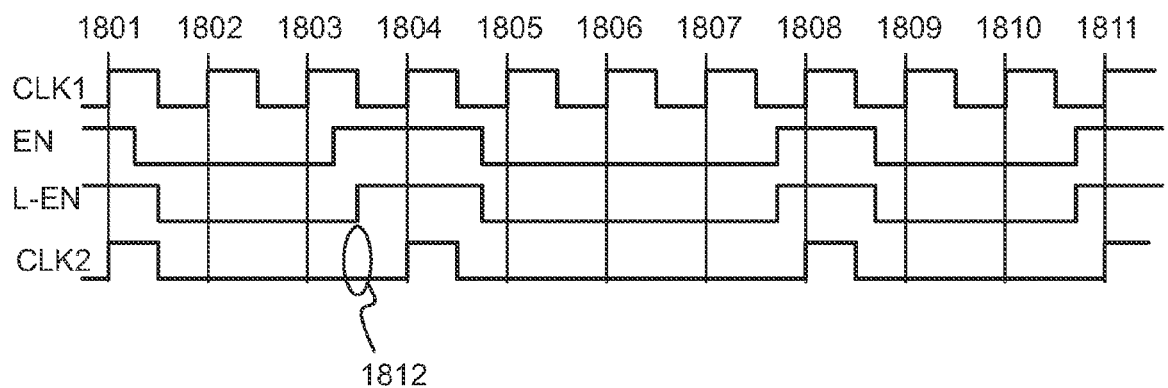
FIG. 18 is a timing diagram of certain signals in a clock gating arrangement according to FIG. 17.
Figure 19:
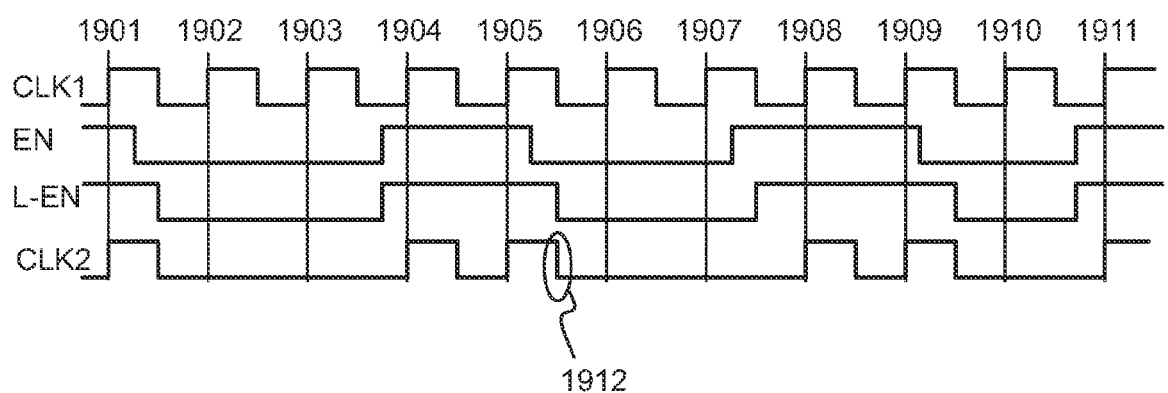
FIG. 19 is a timing diagram of certain signals in a clock gating arrangement according to FIG. 17.

FIGS. 18 and 19 illustrate examples of gating the clock signal in the pipeline of FIG. 17. When the EN signal goes low at the first time in FIG. 18, right after moment 1801, the clock signal CLK1 of the first register circuit 1701 (and consequently also the clock signal CLK2 of the second register circuit 1703) is high. The latch 1705 in the clock gating cell 1704 becomes enabled on the next falling edge of the CLK1 signal and reads in the low state of the EN signal; the AND gate 1706 in the clock gating cell now gets two low outputs so CLK2 goes low. The rising edge of the EN signal after moment 1803 does not immediately cause any reaction in the CLK2 signal, because first the latched enable signal L-EN is still low and then when it goes high, the CLK1 signal is low in turn. Only at the rising edge of the CLK1 signal at moment 1804 the CLK2 signal goes also high, and so on.

The clock gating of FIGS. 18 and 19 works well, if the register circuits 1701 and 1703 in the pipeline are of the single edge triggered flip-flop type. Successful clock gating means that each register circuit receives equally many triggering edges whenever the EN signal is high. We may assume first that the register circuits 1701 and 1703 are triggered by the rising edges of their respective clock signals. Counting the rising edges in both CLK1 and CLK2 in FIGS. 18 and 19 gives equal results whenever the EN signal is high.

However, let us then assume that the register circuits 1701 and 1703 are of the double edge triggered flip-flop type that was generally described earlier with reference to FIG. 14. Now some triggering edges may go missing from the second clock signal CLK2, as in FIG. 18 at the location marked as 1812: during the first whole pulse when the EN signal is high in FIG. 18 there are three edges (rising or falling) altogether in CLK1, but only two in CLK2. Alternatively or additionally it may happen that additional clock edges appear in the second clock signal CLK2: in FIG. 19, the falling edge marked as 1912 is "superfluous", because during the first whole high pulse in the EN signal in FIG. 19 there are three edges in CLK1 but four in CLK2.

It is an objective of the invention to present a method and circuit for performing clock gating for register circuits of the double edge triggered flip-flop type so that a proper number of triggering edges can be ensured in all occasions. It is a further objective of the invention to present such a method and circuit that are well suited for register circuits that are not only of the double edge triggered flip-flop type but also capable of time borrowing.

Said objectives of the invention are achieved by making the clock gating circuit remember its state at the last moment of disabling and to continue from there at each edge of the ungated clock signal, allowing the phase of the gated clock signal to invert if necessary.

It is characteristic to a clock gating circuit of the kind referred to here that the clock gating circuit is configured to freeze the toggling (gated) clock signal at its current value in response to an enabling signal assuming the value that disables delivering said toggling clock signal, and to respond to said enabling signal thereafter assuming the value that enables delivering said toggling clock signal by beginning the continued toggling of said toggling clock signal at the next edge of the input clock signal.

It is characteristic to a clock gating method of the kind referred to here that it comprises freezing the toggling (gated) clock signal at its current value in response to an enabling signal assuming the value that disables delivering said toggling clock signal, and responding to said enabling signal thereafter assuming the value that enables delivering said toggling clock signal by beginning the continued toggling of said toggling clock signal at the next edge of the input clock signal.

The inventive method and circuit for clock gating are based on the insight that for clocking double edge triggered flip-flops it is actually not necessary to require the clock signal to have the same phase. Also oppositely phased clock signals will work, at least as long as it can be ensured that the structure of the double edge triggered flip-flops can prevent having two transparent register circuits in line enabled simultaneously.

Figure 20:
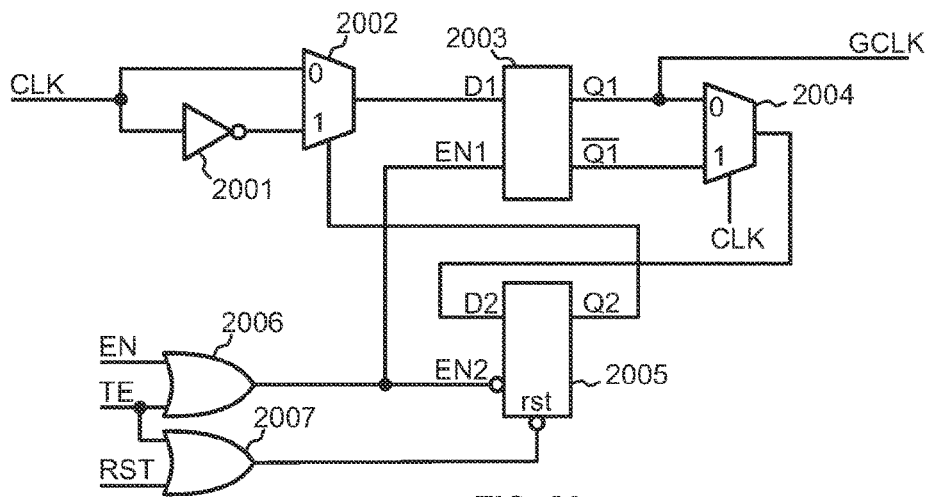
FIG. 20 illustrates a clock gating circuit according to an embodiment.
Figure 21:
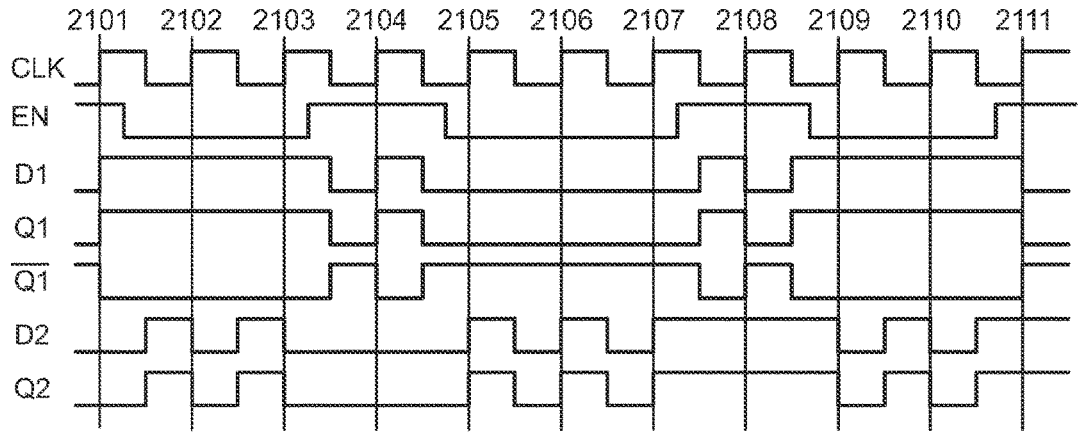
FIG. 21 is a timing diagram of certain signals in a clock gating circuit according to FIG. 20.
Figure 22:
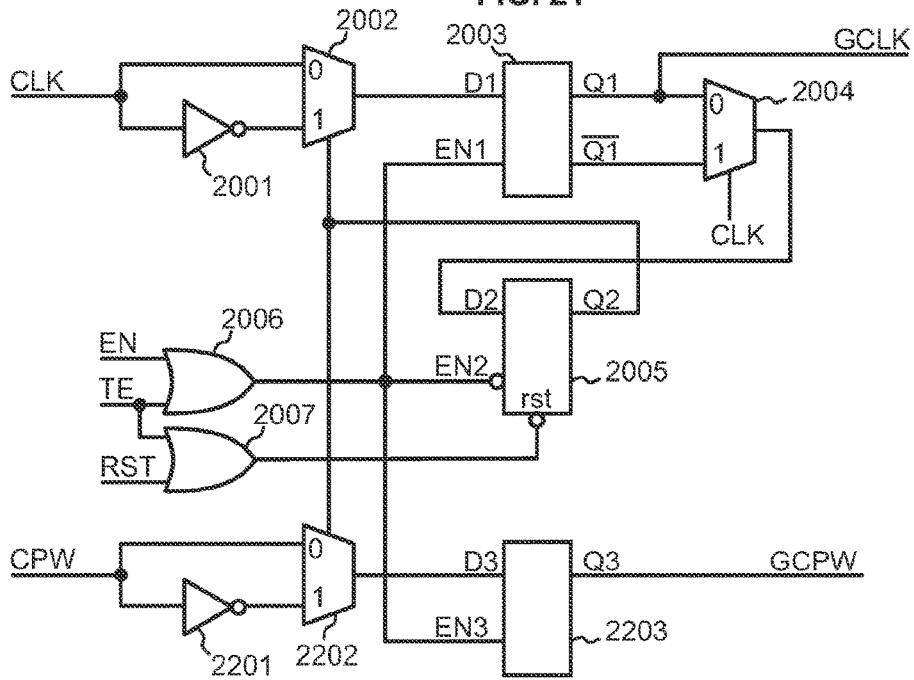
FIG. 22 illustrates a clock gating circuit according to an embodiment.
Figure 23:
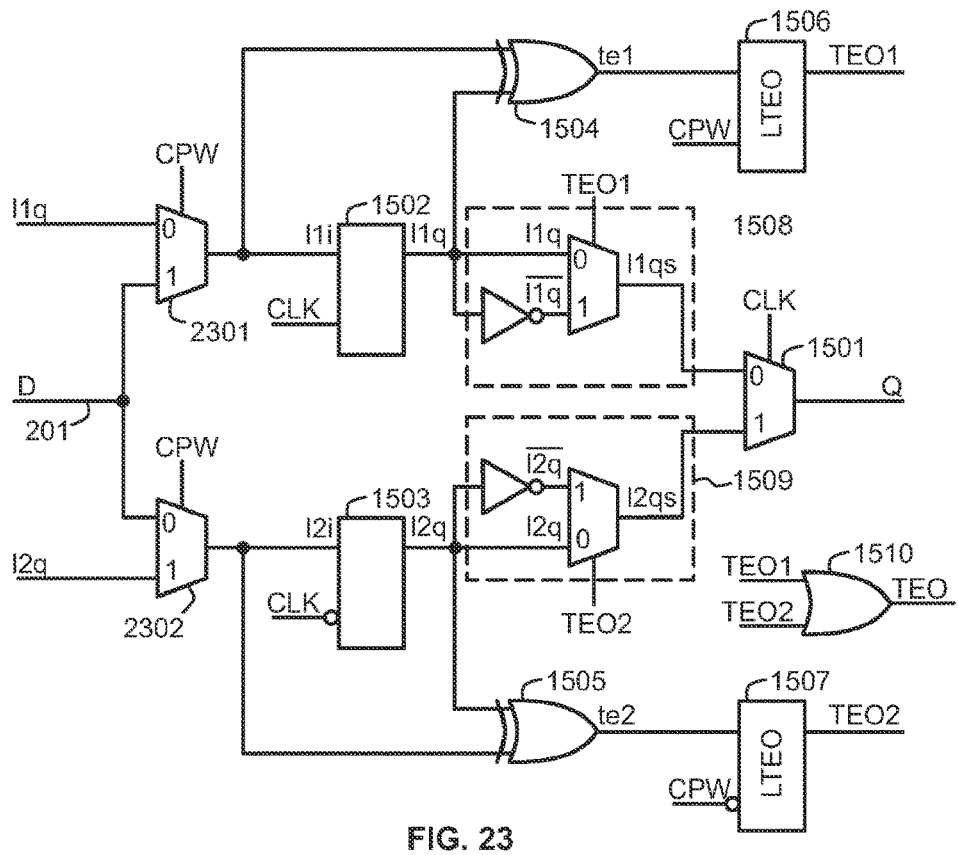
FIG. 23 illustrates a register circuit according to an embodiment.
Figure 24:
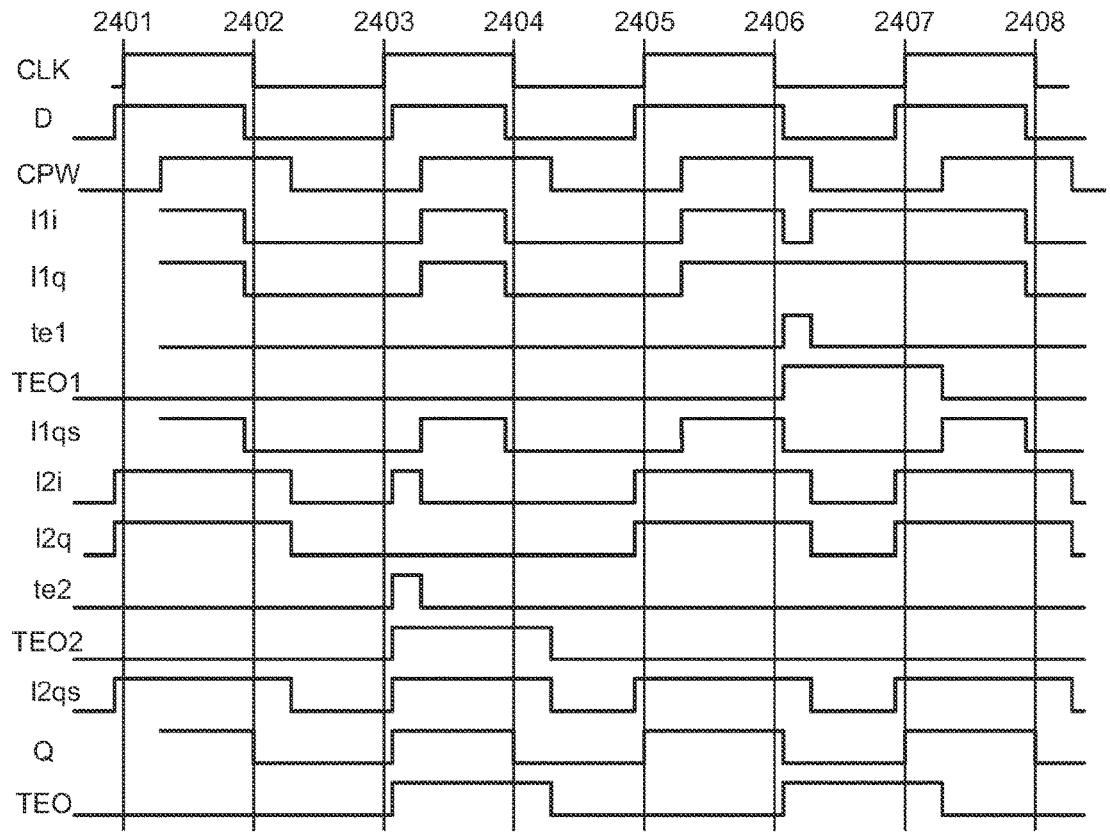
FIG. 24 is a timing diagram of certain signals in a register circuit according to FIG. 23.

Clock gating of the kind described above will be discussed in more detail in the following with reference to FIGS. 20 to 24, in which FIG. 20 illustrates a clock gating cell, FIG. 21 illustrates timing of certain signals in the circuit of FIG. 20, FIG. 22 illustrates a clock gating cell that can also gate a clock pulse window signal, FIG. 23 illustrates a register circuit of the double edge triggered flip-flop type that can prevent the undesired concatenation of transparent stages, and FIG. 24 illustrates timing of certain signals in the circuit of FIG. 23.

FIG. 20 illustrates a so-called clock gating cell, which could be used in place of the more conventional clock gating cell 1704 of FIG. 17. The clock signal CLK to be gated comes in through the clock signal input at the top left corner of FIG. 20, and the gated clock signal GCLK goes out of the gated clock signal output at the top right corner. The clock signals are regular toggling digital signals, as is common in integrated circuits that include clocked digital circuit elements.

The incoming CLK signal goes through two parallel branches, one of which comprises an inverter 2001, to the respective inputs of a first multiplexer 2002. The output of the first multiplexer 2002 goes to the data input of a first latch 2003, the non-inverted output of which provides the gated output clock signal GCLK. The last-mentioned is also taken to a first input of a second multiplexer 2004, the other input of which is coupled to receive the inverted output of the first latch 2003. The selection signal of the second multiplexer 2004 is the CLK signal.

The output of the second multiplexer 2004 goes to the data input of a second latch 2005, the (non-inverted) output of which constitutes the selection signal of the first multiplexer 2002. The enabling signal EN could be taken as such to the first latch 2003 and inverted to the second latch 2005; in FIG. 20 also a test enable signal input is provided for a test enable signal TE, and the two (EN and TE) are combined in a first OR gate 2006. The inverted form of a reset signal RST could be taken as such to a reset input of the second latch 2005: in FIG. 20 the RST and TE signals are taken through a second OR gate 2007, the output of which constitutes the inverted reset signal of the second latch 2005.

In the example case of FIG. 21 it is assumed that the EN signal is first high (meaning that the first latch 2003 is enabled and the second latch 2005 is disabled) and the signal Q2 is first low (meaning that the second latch 2005 was reset). Thus initially the CLK signal goes as such through the first multiplexer 2002 to the data input of the first latch 2003 and further to the gated clock signal output.

After moment 2101 the EN signal goes low; generally it can be said that the enabling signal assumes the value that disables delivering the gated clock signal to those clocked digital circuits that would otherwise receive it. This disables the first latch 2003, so its output signal Q1 is frozen at its current value. Simultaneously the second latch 2005 is enabled, so it begins to read the values of its input signal D2. These, in turn, come from the second multiplexer 2004 which, having its input values frozen, repeatedly alternates between passing them through in the rhythm of the input clock signal CLK. As long as the second latch 2005 remains enabled, the alternating values in its data input go through to its data output. The resulting toggling Q2 signal clocks the first multiplexer 2002, which—due to the inverter 2001 in one of its input branches—ensures that the input signal D1 to the first latch 2003 maintains the value it had when the EN signal went low, even if the CLK signal as such continues to toggle all the time.

After moment 2103 the EN signal goes high again. This happens while the signal D2 (and consequently also Q2) was low, so the value of the signal D1 that the now re-enabled first latch 2003 reads at its input comes from the non-inverted input branch of the first multiplexer 2002. No immediate change takes place in the gated output clock signal GCLK (which is line Q1 in FIG. 21), but the toggling of the output gated clock signal continues at the next edge of the input clock signal CLK in the middle between moments 2103 and 2104. This kind of operation is, as such, similar as that performed by a conventional clock gating circuit, as can be seen by comparing the first halves of lines EN and Q1 in FIG. 21 to those of lines EN and CLK2 of FIG. 18.

However, an important difference to conventional clock gating circuits becomes apparent at the end of the gated clock disabling interval that begins after moment 2104 in FIG. 21. The EN signal goes low when the CLK signal was low just before moment 2105. The output gated clock signal is frozen at its current (low) value, but the input signal D2 to the second latch 2005 begins toggling in rhythm with the input clock signal CLK. Due to the operation of the second latch 2005, the first multiplexer 2002, and the inverter 2001, this causes also the input signal D1 to the first latch 2003 to be frozen at the (low) value it had when the EN signal went low. Now when the EN signal goes high again after moment 2107, the input clock signal CLK is high (i.e. at the opposite value it had when the EN signal went low), and consequently the second multiplexer 2004 is coupling the inverted output of the first latch 2003 to the data input of the second latch 2005. The high value of Q2 causes the inverted input clock signal to constitute, through inverter 2001 and first multiplexer 2002, the input signal D1 to the first latch 2003.

Comparing line Q1 in FIG. 21 after moment 2107 to line CLK2 in FIG. 18 at moment 1812 the important difference is seen. The CLK2 signal passed through by the conventional clock gating circuit of FIG. 17 only begins toggling in synchronism—and in phase—with the CLK1 signal at the next rising edge of the CLK1 signal at moment 1804. The clock gating circuit of FIG. 20 continues the toggling of the gated output clock signal at the very next edge of the input clock signal CLK, which is the falling edge between moments 2107 and 2108. This behavior is typical to the clock gating circuit of FIG. 20: it consistently responds to the enabling signal EN assuming the value that re-enables delivering the toggling gated clock signal GCLK by beginning its continued toggling at the next edge of the input clock signal CLK.

An inevitable consequence of said typical behavior is that the phase of the gated output clock signal may become inverted from what it was, and indeed does so whenever the EN signal goes high during a different phase of the CLK signal than what the CLK signal had when the EN signal went low. This is easy to see in FIG. 21: right after moments 2101 and 2103 the EN signal went low and high respectively while the CLK signal was high at both instances. Consequently the Q1 signal (which constitutes the GCLK signal) continued in phase with the CLK signal after moment 2103. However, between moments 2104 and 2105 the EN signal went low while the CLK signal was low, and right after moment 2107 the EN signal went high while the CLK signal was high. Consequently when the Q1 signal (=GCLK signal) continues toggling after moment 2107, it is phase-inverted in relation to the CLK signal.

Inverting the phase of the gated clock signal does not matter, however, if all flip-flops in the clocked logic circuits, to which the CLK and GCLK signals are delivered, are of the double edge triggered type. For a double edge triggered flip-flop it is only important that there is an edge in the clocking signal, whether it is a rising or a falling edge does not matter.

As a general characterization, a clock gating circuit of the kind described above comprises a phase memory that is configured to memorize the phase of the input clock signal in response to the EN signal going low (i.e. assuming the value that disables delivering the gated clock signal further). The clock gating signal is configured to use the memorized phase as the phase of the gated clock signal in response to the EN signal thereafter going high again. In FIG. 20 the phase memory comprises the first multiplexer 2002 and the inverter 2001 in one of its two input branches. The first multiplexer is configured to be clocked in rhythm with the CLK signal during those periods when the EN signal is low and to stop the clocking of said first multiplexer during those periods when the EN signal is high.

The same principle can be used even if the integrated circuit comprises circuit elements that need a clock pulse window signal for defining the time window during which late-arriving changes in input data should be detected. FIG.

22 illustrates a clock gating circuit that is capable of delivering not only the output gated clock signal GCLK but also an output gated clock pulse window signal GCPW. The clock gating circuit of FIG. 22 comprises a clock pulse window input in the lower left part of the drawing for receiving the input clock pulse window signal CPW, and a gated clock pulse window output for delivering a toggling clock pulse window the desired clocked digital circuits in synchronism with edges in the input clock pulse window signal CPW.

The clock gating circuit of FIG. 22 is configured to freeze the output gated clock pulse window signal GCPW at its current value in response to the EN signal assuming going low, and to respond to the EN signal thereafter going high again by beginning the continued toggling of said output gated clock pulse window signal GCPW at the next edge of the input clock pulse window signal CPW. To this end it comprises another phase memory, consisting of a third multiplexer 2202 and its two input branches, one of which comes through an inverter 2201. The third multiplexer 2202 is clocked with the same signal as the first multiplexer 2002. Its output goes to the data input of a third latch 2203, the output of which provides the output gated clock pulse window signal GCPW. The enabling signal of the third latch 2203 is the same as that of the first latch 2003.

Any integrated circuit could comprise, and benefit from, a clock gating circuit of the kind described above. In particular, advantages are gained in an integrated circuit that comprises one or more double edge triggered flip-flops coupled to receive the output gated clock signal.

Advantageous features of a clock gating signal of the kind described above are recited in concise form in the following numbered clauses.

1. A clock gating circuit for selectively enabling and disabling the delivery of a toggling clock signal to one or more clocked digital circuits, comprising a clock signal input for receiving an input clock signal, a gated clock signal output for delivering said toggling clock signal to said one or more clocked digital circuits in synchronism with edges of said input clock signal, and an enabling input for receiving an enabling signal, two values of which are commands to enable and disable delivering said toggling clock signal respectively, wherein the clock gating circuit is configured to freeze said toggling clock signal at its current value in response to said enabling signal assuming the value that disables delivering said toggling clock signal, and to respond to said enabling signal thereafter assuming the value that enables delivering said toggling clock signal by beginning the continued toggling of said toggling clock signal at the next edge of said input clock signal.

2. A clock gating circuit according to numbered clause 1, comprising a phase memory configured to memorize the phase of said input clock signal in response to said enabling signal assuming the value that disables delivering said toggling clock signal, so that the clock gating circuit is configured to use the memorized phase as the phase of the toggling clock signal in response to said enabling signal thereafter assuming the value that enables delivering said toggling clock signal.

3. A clock gating circuit according to numbered clause 2, wherein said phase memory comprises a first multiplexer with two inputs and an output, so that said input clock signal is coupled to one of said inputs as such and to the other of said inputs inverted.

4. A clock gating circuit according to numbered clause 3, wherein said clock gating circuit is configured to clock said first multiplexer in rhythm with said input clock signal during those periods when said enabling signal has the value that disables delivering said toggling clock signal and to stop the clocking of said first multiplexer during those periods when said enabling signal has the value that enables delivering said toggling clock signal.

5. A clock gating circuit according to any of the numbered clauses 2 to 4, comprising first and second latches, of which the first latch is configured to be enabled by said enabling signal and the second latch is configured to be enabled by an inverse of said enabling signal, and also comprising a second multiplexer configured to be clocked by said input clock signal and to selectively couple, as determined by said clocking input clock signal, either a non-inverted or an inverted output of said first latch to an input of said second latch, wherein an output of said second latch is configured to operate said phase memory.

6. A clock gating circuit according to any of the numbered clauses 1 to 5, comprising a clock pulse window input for receiving an input clock pulse window signal, and a gated clock pulse window signal output for delivering a toggling clock pulse window signal to at least some of said one or more clocked digital circuits in synchronism with edges of said input clock window pulse signal, wherein the clock gating circuit is configured to freeze said toggling clock pulse window signal at its current value in response to said enabling signal assuming the value that disables delivering said toggling clock signal, and to respond to said enabling signal thereafter assuming the value that enables delivering said toggling clock signal by beginning the continued toggling of said toggling clock pulse window signal at the next edge of said input clock pulse window signal.

7. An integrated circuit comprising a clock gating circuit according to any of the numbered clauses 1 to 6.

8. An integrated circuit according to numbered clause 7, comprising one or more double edge triggered flip-flops coupled to receive said toggling clock signal.

9. A set of library instructions for designing a part of an integrated circuit, said set of library instructions being stored on a machine-readable tangible medium and comprising one or more set of one or more machine-readable instructions that, when executed by a computer adapted for designing integrated circuits, are configured to effect the designing of a clock gating circuit according to any of numbered clauses 1 to 6.

A double edge triggered flip-flop, the general structure of which involves the two parallel, oppositely clocked latches in the first pulse-enabled subregister stage (see latches 1401 and 1402 in FIG. 14), makes the input data stored in the lower latch available at its output on the rising edges of the clock signal and that stored in the upper latch on the falling edges of the clock signal. This is a consequence of the fact that each of the latches is transparent while its enabling signal is high.

Considering the example of FIG. 17, we may assume that the register circuits 1701 and 1703 are double edge triggered flip-flops. The data that the first register circuit 1701 made available at its output at a rising edge of the clock signal goes into the combinational logic 1702. The resulting processed data from the combinational logic 1702 should be stored in the second register circuit 1703 and in turn made available at its output on the next falling edge of the clock signal. Conceptually the route of the data goes from a "lower" latch inside the first register circuit 1701 to the "upper" latch inside the second register circuit 1703, where the designations "lower" and "upper" are used even if the corresponding latches are not separately shown in FIG. 17.

Even if the clock gating arrangement that was described earlier involves the important advantage that always the same number of clock edges go to each register circuit when the EN signal is high, it will as also described above—invert the phase of the delayed clock signal if the EN signal remained low for the duration of an odd number of edges in the ungated clock signal. This might result in a situation where two consecutive register circuits, which are both double edge triggered flip-flops and which have a combinational logic unit between them, might both be transparent simultaneously. In the conceptual thinking presented above this would be synonymous with saying that the route of the data went e.g. from a "lower" latch inside the first register circuit 1701 to the "lower" latch inside the second register circuit 1703, which is not desirable because the moment at which the resulting data would become available at the output of the second register circuit 1703 would not be well defined.

FIG. 23 illustrates how the use of two suitably clocked multiplexers at the input of a double edge triggered flip-flop may help to avoid the problem outlined above. The illustrated register circuit is a double edge triggered flip-flop with its basic structure resembling closely that explained earlier with reference to FIG. 15. The data input 201 is coupled to the second input of a first input multiplexer 2301 and to the first input of a second input multiplexer 2302. The first input of the first input multiplexer 2301 is coupled to receive the signal 11q from the data output of the upper latch 1502 in the first pulse-enabled subregister stage. The second input of the second input multiplexer 2302 is coupled to receive the signal 12q from the data output of the lower latch 1503 in the first pulse-enabled subregister stage.

The input multiplexers 2301 and 2302 serve to effectively switch the roles of the upper and lower latches 1502 and 1503 in case the clock signal (and thus also the CPW signal) becomes inverted, as will happen when a clock gating circuit like that of FIG. 22 is used. Thus the possibility of two simultaneously transparent latches in consecutive register stages of a pipeline is avoided.

FIG. 24 is a timing diagram of the signals in the register circuit of FIG. 23. As an example, the late-arriving change in input data associated with moment 2403 can be considered. The change in the data signal D should have come before the moment 2403, but it came only after it. The signal 12q at the data output of the lower latch 1503 did not catch the late-arriving rising edge of the input data, but remains low, because the CLK signal had gone high and the lower latch 1503 was correspondingly disabled. When the rising edge in the input data D comes, the CPW signal is still low, meaning that the rising edge passes through the second input multiplexer 2302 to the input signal 12i of the lower latch 1503. This makes the output signal te2 of the XOR gate 1505 go high. When the CPW signal goes high, the second input multiplexer 2302 switches to feed back the data output signal 12q to the data input of the lower latch 1503, instead of coupling the input data signal D thereto. Now the XOR gate 1505 receives identical inputs again and its output signal te2 returns low. However, the lower timing event observation latch 1507 had already stored the preceding high value of te2 and made it available as the timing event observation component signal TEO2, causing the arrangement 1509 to invert the output of the lower latch 1503 and thus ensuring a valid internal digital value to the appropriate input of the multiplexer 1501, which in this register circuit constitutes the second pulse-enabled subregister stage.

Figure 25:
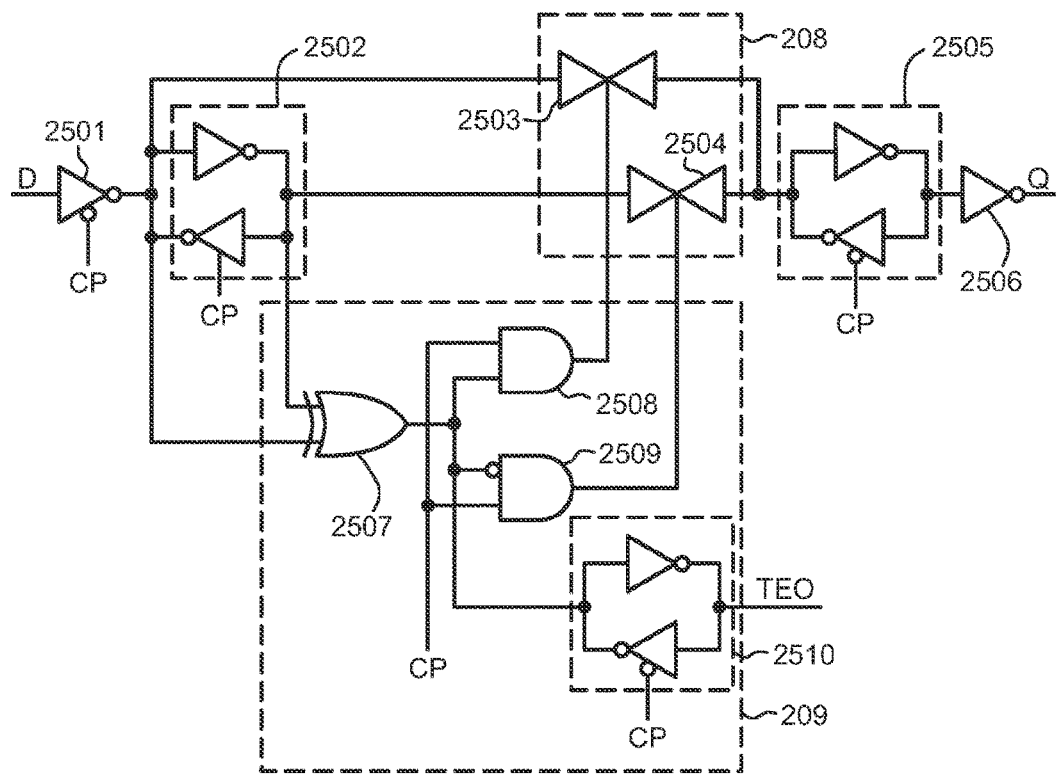
FIG. 25 illustrates a register circuit according to an embodiment.
Figure 26:
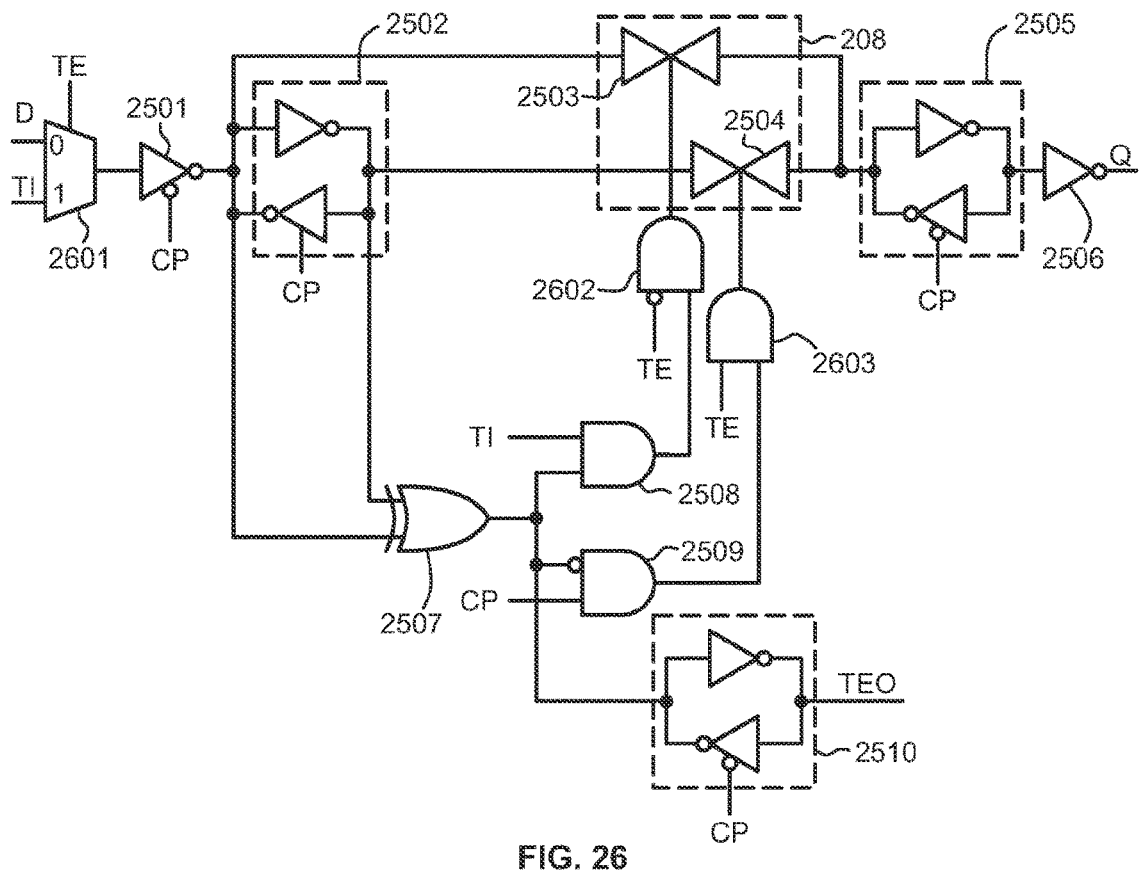
FIG. 26 illustrates a register circuit according to an embodiment.

FIGS. 25 and 26 illustrate embodiments in which the first and second pulse-enabled subregister stages are built of two back-to-back coupled inverters. In FIG. 25 the first inverter 2501 on the left is a kind of an input buffer, and the two back-to-back coupled inverters marked as 2502 constitute essentially a latch. Input signals to the timing event controller 209 include the input and output signals of the first pulse-enabled subregister stage as well as the clock pulse signal CP, so in this respect the configuration resembles the principle explained earlier with reference to FIG. 6. The timing event logic 208 comprises two transmission gates 2503, 2504, each of them placed along a data path from either the input (in case of transmission gate 2503) or output (in case of transmission gate 2504) of the first pair of back-to-back coupled inverters 2502 to the input of the further pair of back-to-back coupled inverters 2505 that constitutes the second pulse-enabled subregister stage. The additional inverter 2506 at the output on the right constitutes an output buffer and simultaneously balances the inversion accomplished by the first inverter 2501 in the input.

The timing event controller 209 of FIG. 25 comprises an XOR gate 2507 coupled to receive the signals from the input and output of the first pair of back-to-back coupled inverters 2502. The output of the XOR gate is coupled to a non-inverting input of a first AND gate 2508 and to an inverting input of a second AND gate 2509. The clock pulse signal CP goes to a non-inverting input of each of said AND gates 2508 and 2509. The outputs of the first and second AND gates control 2508 and 2509 the transmission gates 2503 and 2504 respectively. The output of the XOR gate 2507 also represents the timing event observation signal, which is output from the latch 2510 controlled by the clock pulse signal CP.

The embodiment of FIG. 26 is particularly suited for testing, because it comprises a test input TI for a testing signal and a test enable input TE, to which a high level signal should be coupled to enable testing. The basic topology and components are the same as in FIG. 25, but at the input furthest to the left there is a multiplexer 2601 coupled so that a high value of the test enable signal causes the test input signal to be used as the input signal to the register circuit, while at a low value of the test enable signal it is the normal data signal. The transmission gates 2503 and 2504 are now controlled through respective AND gates 2602 and 2603, the first-mentioned of which gets the test enable signal in its inverting input while the other gets the test enable signal in its non-inverting input. Signals to non-inverting inputs of both AND gates 2602 and 2603 come from the AND gates 2508 and 2509 that were introduced above with reference to FIG. 25, but now only the lower AND gate 2509 receives the clock pulse signal CP while the upper AND gate 2508 receives the test input signal TI instead.

FIGS. 25 and 26 also illustrate one possible approach that can be used as a general principle to ensure passing a valid internal digital value to the second pulse-enabled subregister stage. Namely, it may be noted that whether the input and output signals of the first pulse-enabled subregister stage have the same or different momentary value may depend on whether the change in input data came in time or not. As a simple example the register circuit may be of a single edge triggered flip-flop, triggered by rising edges of the triggering (clock) signal, and its first pulse-enabled subregister stage may be a latch, the enabling signal of which is the inverse of the triggering (clock) signal. In such an arrangement the value at the output of the first pulse-enabled subregister stage follows the value at its input up to the triggering edge, but becomes locked after that. If the change in input data arrived late, it results in a situation where the input value (i.e. the actual valid value to be temporarily stored in the register circuit) is the inverse of the output value of the first pulse-enabled subregister stage.

In the approach illustrated earlier in FIGS. 7, 9, 10, and the like this situation was dealt with by choosing the inverse of the output signal of the first pulse-enabled subregister stage as the input to the second pulse-enabled subregister stage. The alternative approach shown in FIGS. 25 and 26 is to select the input signal of the first pulse-enabled subregister stage as the input of also the second pulse-enabled subregister stage. The end result is the same; only the approach taken to achieve is slightly different.

Said alternative approach, which as an example is shown in the embodiments of FIGS. 25 and 26 but can be combined with other embodiments of the invention, can be generally described so that the timing event stage 206 comprises complementary couplings from the input and output of the first pulse-enabled subregister stage 204 to the input of the second pulse-enabled subregister stage 205, as well as a timing event controller 209 configured to detect any change of the digital value at the data input 201 within a time window that begins at the allowable time limit and is shorter than a half cycle of said triggering signal. The timing event controller 209 is then configured to select that one of said complementary couplings that leads from the input of the first pulse-enabled subregister stage to the input of the second pulse-enabled subregister stage as a response to such change having been detected.

Figure 27:
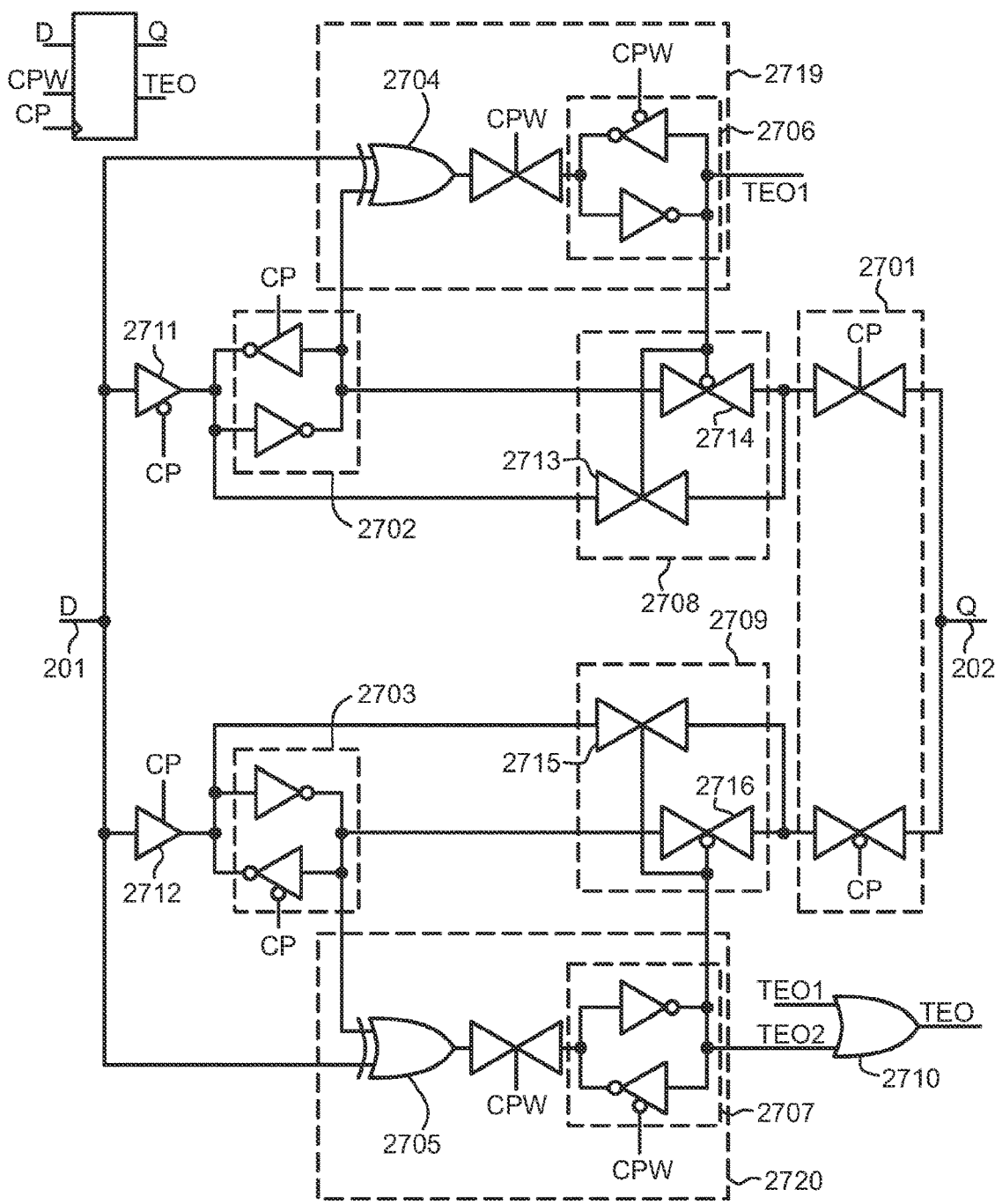
FIG. 27 illustrates a register circuit according to an embodiment.

FIG. 27 illustrates an example of how the approach explained above with reference to FIGS. 25 and 26 can be applied in a double edge triggered flip-flop that otherwise follows the general topology explained earlier with reference to FIG. 15. Resembling FIG. 15, in FIG. 27 the division between first and second parallel latch branches goes along an imaginary horizontal line at the level of the data input 201. The second pulse-enabled subregister stage is marked with the reference designator 2701 and comprises two parallel transmission gates. One of them is configured to selectively couple the output of the first (i.e. upper) parallel latch branch to the data output 202, clocked by the clock signal CP. The other is configured to selectively couple the output of the second (i.e. lower) parallel latch branch to the data output 202, clocked by the inverse of the clock signal CP.

Each of the first and second parallel latch branches comprises a circuit element that is essentially a clocked latch implemented with back-to-back inverters; see circuit elements 2702 and 2703. Said circuit elements are clocked by opposite phases of the clock signal CP, and each of them has an input coupled to the data input 201 through respective clocked buffers 2711 and 2712. The first clocked buffer 2711 is clocked by the inverse of the clock signal CP, and the second clocked buffer 2712 is clocked by the clock signal CP.

From each of the first and second latch branches there is a coupling to a transition detector configured to detect timing events in the respective latch branch. Similar to FIG. 15, also in FIG. 27 each latch branch has a transition detector of its own, and the transition detectors are configured to perform said detecting through comparison of input and output values of the respective clocked latch: see the XOR gates 2704 and 2705. Each transition detector is further configured to produce and temporarily store a respective timing event observation component signal in response to a detected timing event; see latches 2706 and 2707 that are implemented with back-to-back inverters. An alternative embodiment would comprise a common transition detector, to which there would be couplings from each of the first and second latch branches. Such a shared transition detector may be common to even more than two latch branches: for example common to latch branches of more than one register circuit.

Each of the first and second parallel latch branches comprises, between an output of the clocked latch of that latch branch and a respective input of the second pulse-enabled subregister stage 2701, an arrangement configured to selectively invert the output value of the clocked latch in response to a timing event observation component signal produced in that latch branch. In the upper latch branch said arrangement is shown with the reference designator 2708, and in the lower latch branch with the reference designator 2709. Each of these arrangements is similar to the timing event logic 208 that has been described earlier with reference to FIGS. 25 and 26, and the selection between a non-inverted and inverted signal is made in accordance with the appropriate timing event observation component signal TEO1 or TEO2 respectively. The transmission gates that are involved are marked as 2713, 2714, 2715, and 2716 respectively.

The timing event observation component signals TEO1 and TEO2 serve also to produce the timing event observation signal TEO of the whole register circuit: the register circuit is configured to produce said timing event observation signal as a combination of the timing event observation component signals from the first and second parallel latch branches. FIG. 27 shows an example in which an OR gate 2710 is used to produce such a combination so that the TEO signal is active whenever at least one of the timing event observation component signals TEO1 and TEO2 is active. Other implementations are possible, as has been described earlier for example with reference to FIG. 15.

Figure 28:
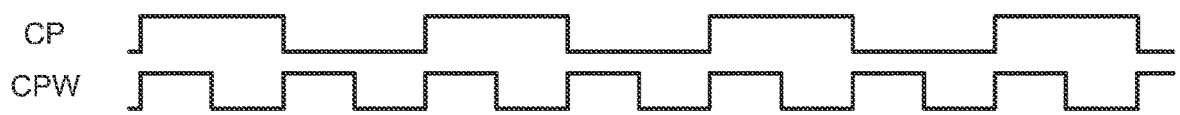
FIG. 28 is a timing diagram of certain signals in a register circuit according to FIG. 27.

The timing event observation latches 2706 and 2707 are clocked with the clock pulse window (CPW) signal, which may be for example a double frequency version of the clock signal CP like in the example of FIG. 28. In this case the time window for detecting a late-arriving change in input data is the time when the CPW signal has a high value.

The alternative approach that has been described above with reference to FIGS. 25, 26, and 27 could also be used to build a register circuit the general topology of which would resemble that of FIG. 23.

A method embodiment of the invention is meant for temporarily storing a digital value obtained from an output of a preceding circuit element and for making such a temporarily stored digital value available for a subsequent circuit element at a controlled moment of time. The method comprises receiving said digital value through a data input for temporary storage, and receiving a clock signal, a triggering edge of which defines an allowable time limit before which a digital value must be available at said data input to become available for said subsequent circuit element. The method comprises also using, between first and second pulse-enabled subregister stages, an internal digital value from the first pulse-enabled subregister stage and information of the changing moment of said digital value at the data input in relation to said allowable time limit to ensure passing a valid internal digital value to the second pulse-enabled subregister stage. Additionally the method comprises using said second pulse-enabled subregister stage for making said valid internal digital value available for said subsequent circuit element, and outputting a timing event observation signal as an indicator of said digital value at said data input having changed within a time window that begins at said allowable time limit and is shorter than one cycle of said clock signal.

As an important difference to prior art methods like the Razor approach described earlier, method embodiments of the invention involve ensuring the valid internal digital value at the second pulse-enabled subregister stage still within the same clock cycle. Even if the change of input data was late, making the valid data available for the subsequent circuit element does not introduce any additional delay (except for the physically unavoidable propagation delays, which however are extremely short in comparison to the clock cycle). As was described earlier, for example the Razor approach wastes a complete clock cycle before making the correct data bit appear at the output of the register.

Changes and modifications are possible to the above-explained example embodiments without parting from the scope of the appended claims. For example, even if the register circuit has been consistently shown to comprise exactly two stages (the first and second pulse-enabled subregister stages), saying that the register circuit comprises a sequence of these stages does not exclude it from having additionally third, fourth, etc. subregister stages along the data path between the data input and the data output. Also, while the register circuits have been described as storing one-bit digital values, a register circuit according to the invention may temporarily store multibit digital values. This can be achieved for example by having parallel data paths between the data input and the data output, each data paths being configured to temporarily store one bit of the multibit value. Selective inverting of multibit values must naturally only involve inverting those bits that are otherwise not valid because they arrived late.

Handling multibit values may involve also time interleaving; in a way, a double edge triggered flip-flop may be considered as a register circuit for temporarily storing two-bit digital values, so that the first bit is temporarily stored and made available on the rising edge of the clock signal and the second bit is temporarily stored and made available on the falling edge of the clock signal.

Two or more register circuits for temporarily storing single-bit digital values can share some logic parts. For example, two or more register circuits of this kind may have common parts related to the timing event stage, like common transition detectors.

Method embodiments of the invention may comprise controlling operating voltage, operating power, operating frequency, data throughput, and/or operating current in dependence with the occurrence of timing event observation signals in an integrated circuit. They may comprise the collecting of timing event observations from a number of register circuits within an integrated circuit, and comparing the collected number of timing event observation signals to a threshold. If the collected number of timing event observation signals is larger than the threshold, at least one of the following may be done: increasing operating voltage, increasing operating power, decreasing operating frequency, decreasing data throughput, increasing operating current. Similarly if the collected number of timing event observation signals is smaller than a threshold, at least one of the following may be done: decreasing operating voltage, decreasing operating power, increasing operating frequency, increasing data throughput, decreasing operating current. Here "number of timing event observation signals" may be an absolute number of counted timing event observation signals, or a mean number of timing event observation signals within a certain period of time. Said thresholds may be the same threshold, or there may be hysteresis so that e.g. after operating voltage was increased in response to having detected more timing events than a first threshold, the number of timing events must decrease below a second, lower threshold before the operating voltage can be decreased again.

Yet another possible variation of the embodiments described so far is to use a so-called pulse to pulse window signal to indicate to the register circuit the time window during which late arriving changes in input data should be detected. A first short pulse of such a pulse to pulse window signal would mark the beginning of the time window, and a subsequent second short pulse would mark the end of the time window.

When timing event observation signals are detected, a higher-level logic that is responsible for correct operation of the pipeline may take certain actions, which are known as such. For example, a certain delay may be introduced in the common clock signal so that circuit elements downstream from the one in which the timing event occurred have sufficient time to recover and ensure that they received the valid data. Here a basic approach of the invention can be considered: the invention ensures outputting a valid digital value from the register circuit; it may only come a bit late, and an indication thereof the TEO signal is activated.

The invention claimed is:

1. A register circuit for temporarily storing a digital value obtained from an output of a preceding circuit element, the register circuit comprising:
    a data input for receiving said digital value for temporary storage,
    a data output for outputting the temporarily stored digital value,
    a triggering event input for receiving a triggering signal, a triggering edge of which defines an allowable time limit before which a digital value must appear at said data input to become temporarily stored, and
    on the data propagation path between said data input and data output a sequence of a first pulse-enabled subregister stage and second pulse-enabled subregister stage;
    wherein said register circuit comprises, between said first and second pulse-enabled subregister stages, a timing event stage configured to use an internal digital value from the first pulse-enabled subregister stage and information of the changing moment of said digital value at the data input in relation to said allowable time limit to ensure passing a valid internal digital value to the second pulse-enabled subregister stage,
    wherein said timing event stage is configured to output a timing event observation signal at an output of said register circuit as an indicator of said digital value at said data input having changed within a time window that begins at said allowable time limit and is shorter than one cycle of said triggering signal, and
    wherein said timing event stage comprises:
        a timing event logic configured to selectively invert the internal digital value obtained from the first pulse-enabled subregister stage and
        a timing event controller configured to detect any change of said digital value at said data input within a time window that begins at said allowable time limit and is shorter than a half cycle of said triggering signal, and configured to make said timing event logic effect said selective inverting as a response to such change having been detected.

2. A register circuit according to claim 1, wherein said register circuit is a flip-flop.

3. A register circuit according to claim 2, wherein said first and second pulse-enabled subregister stages are latches.

4. A register circuit according to claim 1, wherein said timing event controller is configured to generate said timing event observation signal.

5. A register circuit according to claim 1, wherein:
said timing event logic comprises a multiplexer and two parallel value propagation paths from an output of said first pulse-enabled subregister stage to the respective inputs of said multiplexer,
one of said parallel value propagation paths comprises an inverter configured to invert the value going through that value propagation path with respect to the value going through the other propagation path, and
said multiplexer is configured to couple one of said parallel value propagation paths to an input of the second pulse-enabled subregister stage in accordance with the timing event observation signal.

6. A register circuit according to claim 1, wherein said timing event stage comprises:
complementary couplings from the input and output of the first pulse-enabled subregister stage to the input of the second pulse-enabled subregister stage and
a timing event controller configured to detect any change of said digital value at said data input within a time window that begins at said allowable time limit and is shorter than a half cycle of said triggering signal, and configured to select that one of said complementary couplings that leads from the input of the first pulse-enabled subregister stage to the input of the second pulse-enabled subregister stage as a response to such change having been detected.

7. A register circuit according to claim 1, wherein the length of the time window is defined by an internal feature of the timing event stage.

8. A register circuit according to claim 1, wherein the register circuit comprises a time window input for receiving a pulsed signal, pulses of which are to define the length of the time window.

9. A register circuit according to claim 8, wherein said time window input is coupled to said timing event stage.

10. A register circuit according to claim 8, wherein said time window input is coupled to said second pulse-enabled subregister stage.

11. A register circuit according to claim 1, wherein the register circuit is a double edge triggered flip-flop.

12. A register circuit according to claim 11, wherein:
said first pulse-enabled subregister stage comprises first and second parallel latch branches clocked at opposite phases of said triggering signal,
said second pulse-enabled subregister stage comprises a multiplexer clocked by said triggering signal,
each of said first and second parallel latch branches comprises a clocked latch, an input of which is coupled to said data input,
from each of said first and second latch branches there is a coupling to a transition detector configured to detect timing events in the respective latch branch through comparison of input and output values of the respective clocked latch and to produce a respective timing event observation component signal in response to a detected timing event,
each of said first and second parallel latch branches comprises, between an output of the clocked latch and a respective input of said multiplexer, an arrangement configured to selectively invert the output value of the respective clocked latch in response to timing event observation component signal produced in that latch branch, and the register circuit is configured to produce said timing event observation signal as a combination of the timing event observation component signals from the first and second parallel latch branches.

13. A register circuit according to claim 1, wherein:
each of the first and second pulse-enabled subregister stages comprises a back-to-back coupling of two inverters, one of which comprises an enabling input,
the timing event controller comprises an XOR gate coupled to receive into its inputs signals from the input and output of the first pulse-enabled subregister stage,
the timing event controller comprises two parallel AND gates, one thereof being coupled to receive the output signal of said XOR gate in its first input while the other is coupled to receive the inverted output signal of said XOR gate in its first input, and each of said two AND gates is coupled to receive a pulsed signal in its second input, and
the outputs of said two AND gates are coupled to select, whether the input signal of the first pulse-enabled subregister stage or the output signal of the first pulse-enabled subregister stage is coupled to the input of the second pulse-enabled subregister stage.

14. An integrated circuit, comprising at least one register circuit for temporarily storing a digital value obtained from an output of a circuit element preceding said at least one register circuit in the integrated circuit, the at least one register circuit comprising:
the data input for receiving said digital value for temporary storage,
a data input for outputting the temporarily stored a digital value,
a triggering event input for receiving a triggering signal, a triggering edge of which defines an allowable time limit before which a digital value must appear at said data input to become temporarily stored, and
on the data propagation path between said data input and data output a sequence of a first pulse-enabled subregister stage and second pulse-enabled subregister stage;
wherein said at least one register comprises, between said first and second pulse-enabled subregister stages, a timing event stage configured to use an internal digital value from the first pulse-enabled subregister stage and information of the changing moment of said digital value at the data input in relation to said allowable time limit to ensure passing a valid internal digital value to the second pulse-enabled subregister stage,
wherein said timing event stage is configured to output a timing event observation signal at an output of said at least one register circuit as an indicator of said digital value at said data input having changed within a time window that begins at said allowable time limit and is shorter than one cycle of said triggering signal, and
wherein said timing event stage comprises:
a timing event logic configured to selectively invert the internal digital value obtained from the first pulse-enabled subregister stage and
a timing event controller configured to detect any change of said digital value at said data input within a time window that begins at said allowable time limit and is shorter than a half cycle of said triggering signal, and configured to make said timing event logic effect said selective inverting as a response to such change having been detected.

15. An integrated circuit according to claim 14, comprising a multitude of data processing paths, wherein said at least one register circuit is located along such a data processing path the time criticality of which is higher than that of another data processing path within said integrated circuit.

16. A method for temporarily storing a digital value obtained from an output of a preceding circuit element and for making such a temporarily stored digital value available for a subsequent circuit element at a controlled moment of time, the method comprising:
  receiving said digital value through a data input for temporary storage, and
  receiving a triggering signal, a triggering edge of which defines an allowable time limit before which a digital value must be available at said data input to become available for said subsequent circuit element,
  using, between first and second pulse-enabled subregister stages, an internal digital value from the first pulse-enabled subregister stage and information of the changing moment of said digital value at the data input in relation to said allowable time limit to ensure passing a valid internal digital value to the second pulse-enabled subregister stage,
  using said second pulse-enabled subregister stage for making said valid internal digital value available for said subsequent circuit element, and
  outputting a timing event observation signal as an indicator of said digital value at said data input having changed within a time window that begins at said allowable time limit and is shorter than one cycle of said triggering signal;
  wherein the method comprises:
    using a timing event logic to selectively invert the internal digital value obtained from the first pulse-enabled subregister stage and
    using a timing event controller configured to detect any change of said digital value at said data input within a time window that begins at said allowable time limit and is shorter than a half cycle of said triggering signal, and configured to make said timing event logic effect said selective inverting as a response to such change having been detected.

17. A set of library instructions for designing a part of an integrated circuit, said set of library instructions being stored on a machine-readable tangible medium and comprising one or more set of one or more machine-readable instructions that, when executed by a computer adapted for designing integrated circuits, are configured to effect the designing of a register circuit for performing a method according to claim 16.

18. A method according to claim 16, comprising:
  controlling one of: operating voltage, operating power, operating frequency, data throughput, operating current; in dependence with the occurrence of said timing event observation signal in an integrated circuit.

19. A method according to claim 18, comprising:
  collecting timing event observations from a number of register circuits within said integrated circuit, and comparing the collected number of timing event observation signals to a threshold,
  doing at least one of: increasing operating voltage, increasing operating power, decreasing operating frequency, decreasing data throughput, increasing operating current; if said collected number of timing event observation signals is larger than a threshold.

20. A method according to claim 18, comprising:
  doing at least one of: decreasing operating voltage, decreasing operating power, increasing operating frequency, increasing data throughput, decreasing operating current; if said collected number of timing event observation signals is smaller than a threshold.

* * * * *